(12) United States Patent
Nishio et al.

(10) Patent No.: US 9,565,780 B2
(45) Date of Patent: Feb. 7, 2017

(54) ELECTRONIC CIRCUIT UNIT CAPABLE OF EXTERNAL CONNECTION

(75) Inventors: Akihiro Nishio, Yokkaichi (JP); Hiroki Hirai, Yokkaichi (JP); Tetsuji Tanaka, Yokkaichi (JP); Massaki Tabata, Yokkaichi (JP); Yasuo Omori, Yokkaichi (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Inc., Osaka-Shi, Osaka (JP)

( * ) Notice: Subject to any disclaimer, the term of this patent is extended or adjusted under 35 U.S.C. 154(b) by 390 days.

(21) Appl. No.: 14/350,201

(22) PCT Filed: Oct. 12, 2011

(86) PCT No.: PCT/JP2011/005710
§ 371 (c)(1),
(2), (4) Date: Apr. 7, 2014

(87) PCT Pub. No.: WO2013/051075
PCT Pub. Date: Apr. 11, 2013

(65) Prior Publication Data
US 2014/0305691 A1 Oct. 16, 2014

(30) Foreign Application Priority Data
Oct. 5, 2011 (JP) ................................ 2011-221217

(51) Int. Cl.
*H05K 5/00* (2006.01)
*H01R 12/75* (2011.01)
(Continued)

(52) U.S. Cl.
CPC .......... *H05K 5/0069* (2013.01); *H01R 12/721* (2013.01); *H01R 12/75* (2013.01);
(Continued)

(58) Field of Classification Search
CPC ....... H01R 13/42; H01R 12/721; H01R 12/75; H01R 9/0515; H01R 9/091
See application file for complete search history.

(56) References Cited

U.S. PATENT DOCUMENTS 3,808,578 A * 4/1974 Hansen ................ H01R 12/721
439/595
5,472,352 A 12/1995 Nishide et al.
(Continued)

FOREIGN PATENT DOCUMENTS

JP 5-38962 5/1993
JP 8-77320 3/1996
(Continued)

OTHER PUBLICATIONS

International Search Report of Dec. 20, 2011.

*Primary Examiner* — Hoa C Nguyen
*Assistant Examiner* — Amol Patel
(74) *Attorney, Agent, or Firm* — Gerald E. Hespos; Michael J. Porco; Matthew T. Hespos

(57) ABSTRACT

Provided is an electronic circuit unit which includes a circuit board, a case for the circuit board and a connector for external connection and can be miniaturized and simplified in structure. This electronic circuit unit includes a circuit board (10) provided with a plurality of conductors for connection (14) on an edge part (12), a case (CS) configured to house the circuit board, and a plurality of terminals (30) provided on ends of a plurality of wires (W). The case (CS) integrally includes a board housing portion (20) and a terminal holding portion (40). The board housing portion (20) holds the circuit board (10) at a specific board holding position. The terminal holding portion (40) holds these terminals (30) in such an arrangement that each terminal (30) comes into contact with each conductor for connection (14) of the circuit board (10) at the board holding position.

20 Claims, 21 Drawing Sheets

(51) Int. Cl.
  *H01R 12/72* (2011.01)
  *H01R 13/42* (2006.01)
(52) U.S. Cl.
  CPC ............ *H01R 13/42* (2013.01); *H05K 5/006* (2013.01); *H05K 5/0039* (2013.01)

(56) References Cited

U.S. PATENT DOCUMENTS

| | | | |
|---|---|---|---|
| 5,653,638 A | 8/1997 | Nagata | |
| 6,178,094 B1 * | 1/2001 | Hakozaki | H05K 7/1418 |
| | | | 16/95 R |
| 6,679,739 B2 * | 1/2004 | Fujita | H01R 13/11 |
| | | | 439/637 |
| 6,896,536 B1 * | 5/2005 | Nguyen | H01R 13/6272 |
| | | | 439/299 |
| 2005/0270753 A1 * | 12/2005 | Morisada | H05K 7/1405 |
| | | | 361/752 |

FOREIGN PATENT DOCUMENTS

| | | | |
|---|---|---|---|
| JP | 7-32869 | | 6/1996 |
| JP | 8-185920 | | 7/1996 |
| JP | 08185920 A | * | 7/1996 |
| JP | 10-92528 | | 4/1998 |
| JP | 10092528 A | * | 4/1998 |
| JP | 10-154552 | | 6/1998 |
| JP | 2000-77869 | | 3/2000 |
| JP | 2000077869 A | * | 3/2000 |
| JP | 2008-112682 | | 5/2008 |
| JP | 2011-28856 | | 2/2011 |

\* cited by examiner

ELECTRONIC CIRCUIT UNIT CAPABLE OF EXTERNAL CONNECTION

BACKGROUND

1. Field of the Invention

The present invention relates to an electronic circuit unit which is mounted in a vehicle such as an automotive vehicle and connectable to an external circuit via a plurality of wires.

2. Description of the Related Art

Conventionally, many electronic circuit units each provided with a circuit board fitted with an electronic circuit and a board connector for connecting wires for external connection to conductors for connection on this circuit board are known as electronic circuit units to be mounted in vehicles. Further, a so-called card edge connector to be mounted on an edge part of the circuit board is known as the board connector.

For example, Japanese Unexamined Patent Publication No. 2008-112682 below discloses a connector provided with terminals 92 provided on ends of a plurality of wires, a terminal-side housing 94 for holding these terminals 92, and a board-side housing 98 fixed to an edge part of a circuit board 96 as shown in FIG. 23.

Each terminal 92 includes a resilient contact piece 93 resiliently displaceable in a thickness direction of the circuit board 96. This resilient contact piece 93 is resiliently displaced by receiving a reaction force from a surface of the circuit board 96 when coming into contact with this surface and pressed into contact with the conductor for connection on this surface by a resilient restoring force thereof.

The terminal-side housing 94 holds the terminals 92 in such an arrangement that the resilient contact pieces 93 of the respective terminals 92 sandwich the circuit board 96 from both sides of the circuit board 96 and a plurality of terminals 92 are juxtaposed along a width direction of the circuit board 96. The board-side housing 98 is shaped to be able to receive the terminal-side housing 94 and locks the terminal-side housing 94 at a position where the resilient contact pieces 93 of the respective terminals 92 are held in contact with the conductors for connection of the circuit board 96.

In an electronic circuit unit using the connector 90, the miniaturization and structure simplification of the entire electronic circuit unit are difficult. Specifically, the connector 90 requires the terminal-side housing 94 for holding the plurality of terminals 92 and the board-side housing 98 for locking the terminal-side housing 94 to the circuit board 96. Further, the circuit board is housed in a predetermined case, but this case has to house the connector 90 to be mounted on the circuit board 96 in addition to the circuit board 96 and is enlarged by that much.

To solve the above problem, the present invention aims to provide an electronic circuit unit which includes a circuit board, a case for housing the circuit board and a plurality of terminals for external connection and can be miniaturized and simplified in structure.

SUMMARY OF THE INVENTION

A first electronic circuit unit provided by the present invention includes a circuit board including an edge part and a plurality of conductors for connection provided on a surface thereof, a case configured to house the circuit board, and a plurality of terminals provided on ends of wires to be connected to the respective conductors for connection of the circuit board and each including a board contact portion which comes into contact with the corresponding conductor for connection. The case includes a board housing portion configured to house the circuit board while holding the circuit board at a specific board holding position and a terminal holding portion configured to hold each terminal, and the terminal holding portion includes a plurality of terminal accommodating chambers into which each terminal is insertable from the outside to the inside of the case, and a plurality of terminal locking portions configured to lock the terminal inserted into each terminal accommodating chamber at a position where the board contact portion of the terminal comes into contact with the corresponding one of the conductors for connection.

A second electronic circuit unit provided by the present invention includes a circuit board including a first edge part and a second edge part facing opposite sides and a plurality of first conductors for connection and a plurality of second conductors for connection provided on surfaces of the respective edge parts, a case configured to house the circuit board, a plurality of first terminals provided on ends of wires to be connected to the first conductors for connection of the circuit board and each including a board contact portion which comes into contact with the corresponding first conductor for connection, and a plurality of second terminals provided on ends of wires to be connected to the second conductors for connection of the circuit board and each including a board contact portion which comes into contact with the corresponding second conductor for connection. The case is divided into a first case member and a second case member, the first case member includes a first board housing portion configured to house a part of the circuit board on the side of the first edge part while holding the part from both sides in a plate thickness direction, a first terminal holding portion configured to hold each first terminal and a first board restraining portion configured to restrain the first edge part in a board restraining direction perpendicular to the plate thickness direction of the circuit board and parallel to an axial direction of the first terminals, and the second case member includes a second board housing portion configured to house a part of the circuit board on the side of the second edge part while holding the part from both sides in the plate thickness direction, a second terminal holding portion configured to hold each second terminal and a second board restraining portion configured to restrain the second edge part in the board restraining direction. The first and second case members are shaped to restrain the circuit board between the first and second board restraining portions in a state united with each other. The first terminal holding portion includes a plurality of terminal accommodating chambers into which each first terminal is insertable from the outside to the inside of the case and a plurality of terminal locking portions configured to lock each first terminal inserted into the terminal accommodating chamber at a position where the board contact portion of the first terminal comes into contact with the corresponding one of the first conductors for connection, and the second terminal holding portion includes a plurality of terminal accommodating chambers into which each second terminal is insertable from the outside to the inside of the case and a plurality of terminal locking portions configured to lock each second terminal inserted into the terminal accommodating chamber at a position where the board contact portion of the second terminal comes into contact with the corresponding one of the second conductors for connection.

DETAILED DESCRIPTION OF THE PREFERRED EMBODIMENTS

Figure 1:
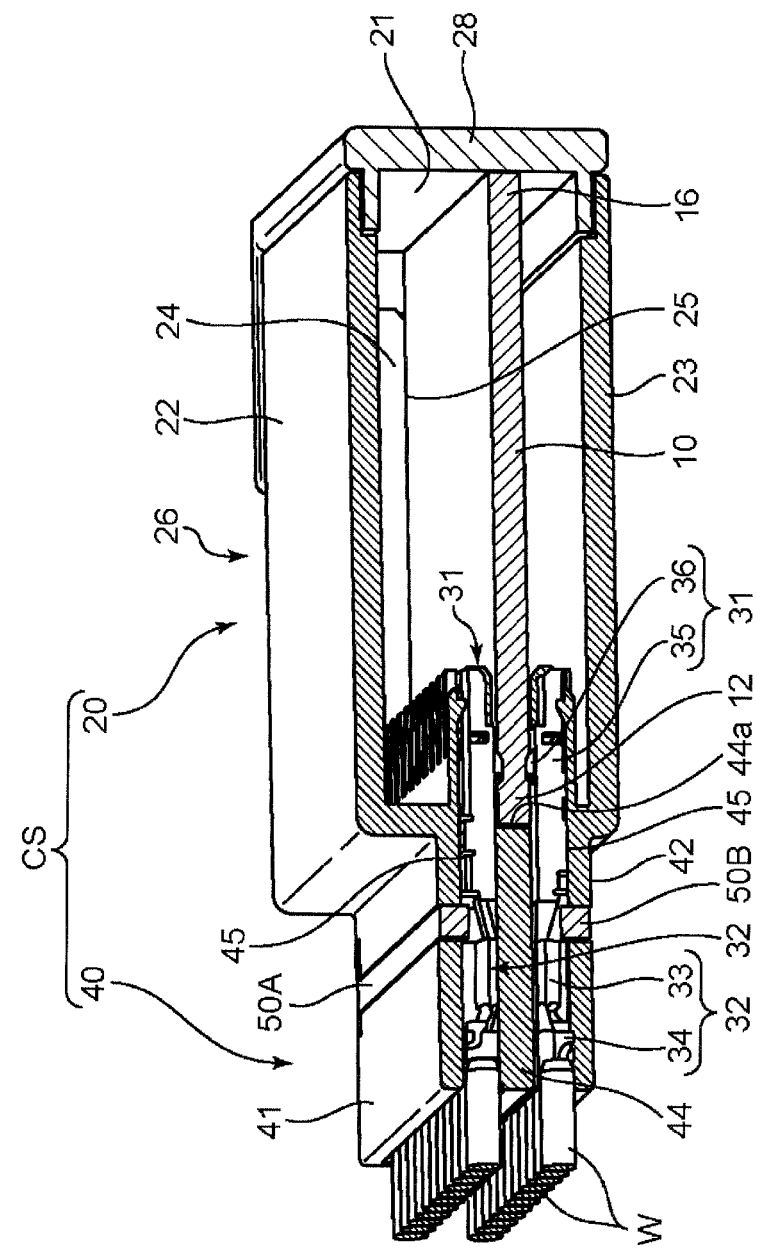
FIG. 1 is a perspective view in section showing a state where a circuit board, a case and terminals of an electronic circuit unit according to a first embodiment of the present invention are assembled.

A first embodiment of the present invention is described with reference to FIGS. 1 to 6.

An electronic circuit unit according to this embodiment includes a circuit board 10, a case CS for housing the circuit board 10, and a plurality of terminals 30 for connecting a plurality of wires W to the circuit board 10.

The circuit board 10 is, for example, a printed circuit board, conductor patterns for circuit configuration are arranged on both sides thereof, and electronic components constituting circuits are mounted thereon. The circuit board 10 according to this embodiment has a rectangular shape. A plurality of conductors for connection 14 in the form of thin plates are provided on the top surface and the under surface of one edge part (left edge part in FIGS. 1 and 4) of the circuit board 10. These conductors for connection 14 are arranged along the edge part 12.

The case CS is made of an insulating material such as plastic and includes a board housing portion 20 and a terminal holding portion 40.

The board housing portion 20 includes a main body 28 with an opening 21 which is open in a specific direction (leftward direction in FIGS. 1 and 4) and a lid portion 26 to be removably attached to this main body, and is shaped to allow the circuit board 10 to be inserted in a board inserting direction (leftward direction in FIGS. 1 and 4 in this embodiment) perpendicular to a plate thickness direction of the circuit board 10.

Specifically, the main body 28 includes a ceiling wall 22, a bottom wall 23 and a pair of left and right side walls 24. The ceiling wall 22 and the bottom wall 23 are arranged on upper and lower sides in postures parallel to each other. The both side walls 24 are arranged between the ceiling wall 22 and the bottom wall 23 and form a rectangular tube body together with the ceiling wall 22 and the bottom wall 23. The lid portion 26 is removably attached to a peripheral edge part of the opening 21 to close the opening 21 which is an opening on one side of the rectangular tube body.

A guiding groove 25 is formed in the inner side surface of each side wall 24. The respective guiding grooves 25 extend in the board inserting direction and have a width enabling left and right edge parts of the circuit board 10 to be inserted thereinto. By the insertion of the circuit board 10 into the board housing portion 20 associated with this insertion, the left and right edge parts of the circuit board 10 are held from both sides (upper and lower sides in this embodiment) by the both side walls 24, i.e. sandwiched from both sides in the plate thickness direction of this circuit board 10.

Each terminal 30 is mounted on an end of the corresponding wire W. Each wire W is composed of an unillustrated conductor and an insulation coating covering the conductor. The insulation coating is partly removed at the end of the wire W to expose the conductor.

Each terminal 30 is made of an electrically conductive metal plate and mounted on the end of the corresponding wire W. Specifically, each terminal 30 includes a board contact portion 31 and a wire connecting portion 32 arranged one after the other. The wire connecting portion 32 includes left and right conductor barrels 33 and left and right insulation barrels 34 arranged one after the other. The both conductor barrels 33 are so crimped to the conductor as to embrace the conductor exposed at the end of the wire W, thereby being electrically conductively connected to the conductor. The both insulation barrels 34 are so crimped to the wire W as to embrace a part of the insulation coating located behind the exposed part of the conductor.

Figure 6:
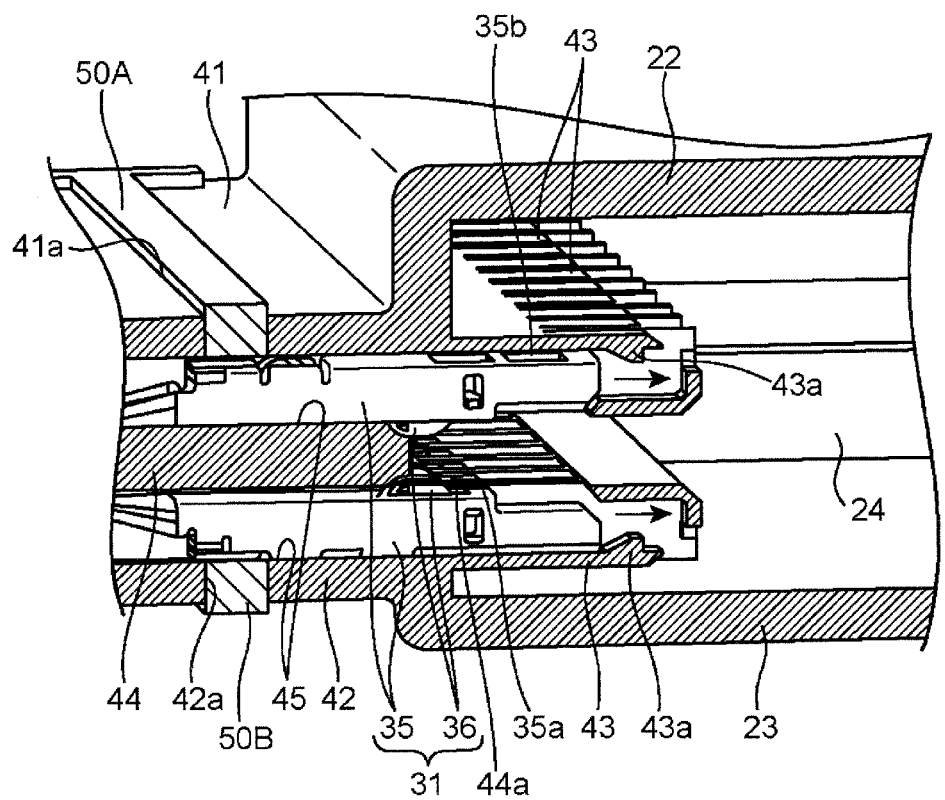
FIG. 6 is a perspective view in section showing the board housing portion in detail.

The board contact portion 31 is composed of a box-shaped main body 35 extending in a terminal axial direction and a resilient contact piece 36 protruding in a direction perpendicular to the terminal axial direction from the main body 35 as shown in FIG. 6. The main body 35 is integrally formed to the wire connecting portion 32 and obtained by forming a part of the metal plate forming the wire connecting portion 32 into a rectangular tube shape. A window 35a is formed to penetrate through one of four walls forming this main body 35. The resilient contact piece 36 protrudes in an arched manner from the inside of the main body 35 to the outside of the main body 35 through the window 35a. However, when coming into contact with the conductor for connection 14 of the edge part 12 of the circuit board 10, this resilient contact piece 36 receives a reaction force from the edge part 12, is deflected and displaced to retract into the window 35a and is pressed into contact with the conductor for connection 14 by a resilient force thereof.

The terminal holding portion 40 is located on a side of the board housing portion 20 opposite to the opening 21 and integrally formed to the main body 28 of the board housing portion 20. The terminal holding portion 40 collectively holds the terminals 30 in such an arrangement that the resilient contact pieces 36 of the respective terminals 30 simultaneously come into contact with the conductors for connection 14 on the opposite surfaces of the edge part 12 of the circuit board 10.

Specifically, this terminal holding portion 40 includes a pair of upper and lower ceiling wall 41 and bottom wall 42 extending in parallel to each other, an intermediate wall 44 located between these ceiling wall 41 and bottom wall 42, and a pair of left and right side walls 46 (only one side wall 46 is shown in FIG. 6). A plurality of terminal accommodating chambers 45 juxtaposed in a lateral direction are formed between the ceiling wall 41 and the intermediate wall 44 and between the bottom wall 42 and the intermediate wall 44. Each terminal accommodating portion 45 is shaped to allow the corresponding terminal 30 to be inserted from the outside to the inside of the case CS and the resilient contact piece 36 of the terminal 30 to face the board housing portion 20.

The intermediate wall 44 is located at the same height as the guiding grooves 25. A front end (right end in FIG. 1) 44a of the intermediate wall 44 is located behind the front ends of the ceiling wall 41 and the bottom wall 42, and a board insertion space into which the edge part 12 of the circuit board 10 is insertable is ensured before the front end 44a of the intermediate wall 44. Each terminal 30 is so held in the terminal holding portion 40 that the resilient contact piece 36 of the terminal 30 faces the board insertion space.

Specifically, the terminals 30 accommodated in the terminal accommodating chambers between the ceiling wall 41 and the intermediate wall 44 (terminals 30 in an upper row) are so held in the terminal holding portion 40 that the resilient contact pieces 36 thereof face downward, and the terminals 30 accommodated in the terminal accommodating chambers between the bottom wall 42 and the intermediate wall 44 (terminals 30 in a lower row) are so held in the terminal holding portion 40 that the resilient contact pieces 36 thereof face upward. The intermediate wall 44 is interposed between a group of the upper terminals 30 and a group of the lower terminals 30.

Holding positions of the respective terminals 30 in the terminal holding portion 40 are so set that the resilient contact pieces 36 of the terminals 30 simultaneously come into contact with the conductors for connection 14 of the circuit board 10 at a position where the edge part 12 of the circuit board 10 is completely inserted in the board insertion space and an end surface of the edge part 12 is in contact with the front end 44a of the intermediate wall 44. That is, the front end 44a of the intermediate wall 44 constitutes a "board restraining portion" for restraining the circuit board 10 in the board inserting direction, and sandwiches the circuit board 10 between the front end 44a and the lid portion 26 attached to the main body 28 from both sides in the board inserting direction. This sandwiching position corresponds to a proper "board holding position". In other words, a dimension of the circuit board 10 in the board inserting direction is set substantially equal to a distance between the front end 44a of the intermediate wall 44 and the inner surface of the lid portion 26 attached to the main body 28.

The terminal holding portion 40 includes a plurality of locking lances (terminal locking portions) 43 for holding each terminal 30. Each locking lance 43 is deflected and displaced in a direction to be retracted from the terminal 30 when the terminal 30 is inserted into the terminal accommodating chamber 45 from the outside of the case CS (left side in FIGS. 1 and 4) and locks an appropriate position of the terminal 30 by being resiliently restored when the insertion of the terminal 30 is completed. In this embodiment, a locking projection 43a as shown in FIG. 6 is formed on an end part of the locking lance 43, whereas a locked hole 35b is formed in a wall of the main body 35 of the board contact portion 31 of the terminal 30 opposite to the resilient contact piece 36 and the locking projection 43a is fitted into this locked hole 35b.

Figure 3:
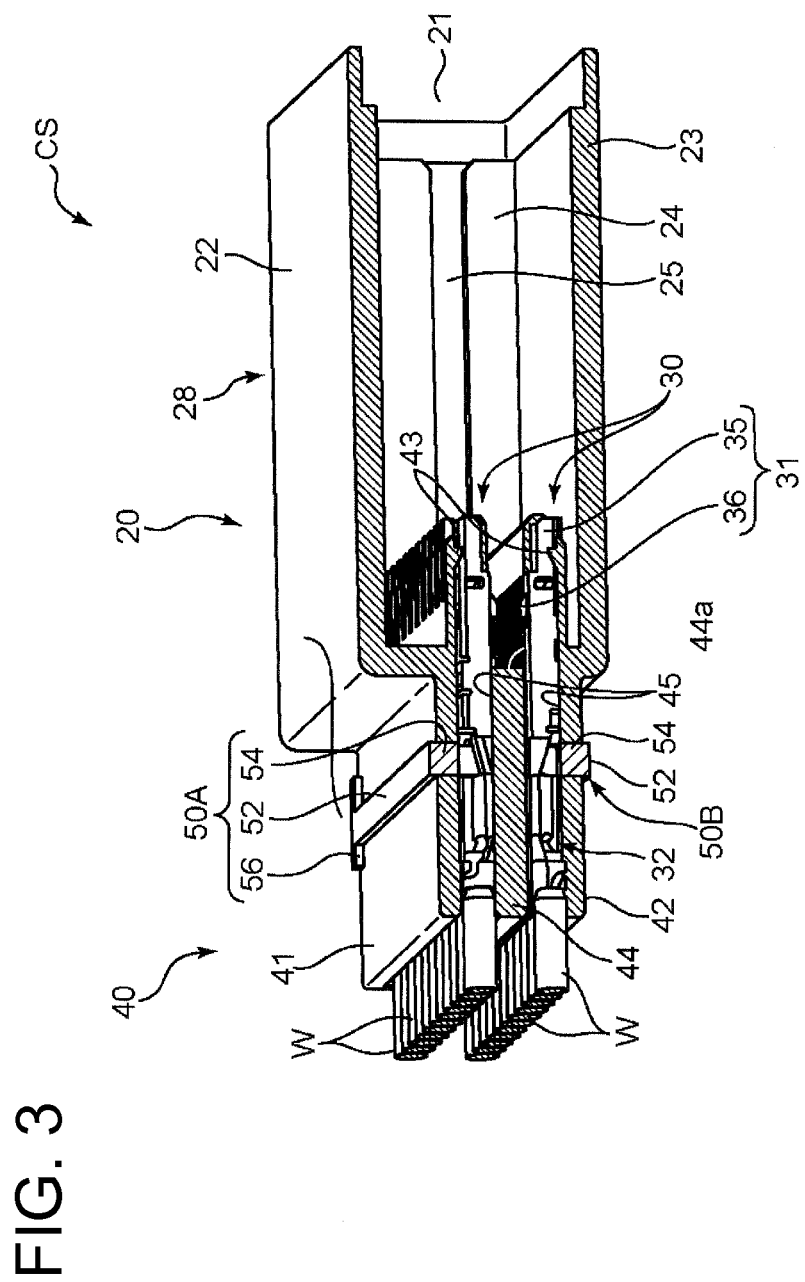
FIG. 3 is a perspective view in section showing a state where retainers for doubly locking the terminals are at a partial locking position in the terminal holding portion.

In this embodiment, a pair of upper and lower retainers 50A, 50B are added to the terminal holding portion 40. These retainers 50A, 50B are for doubly locking (locking in addition to locking by the locking lances 43) the terminals 30 arranged on the lower and upper sides of the intermediate wall 44 and respectively mounted into the ceiling wall 41 and the bottom wall 42 of the terminal holding portion 40. Each retainer 50A, 50B includes an outer wall 52 extending in a direction parallel to an arrangement direction of the respective terminals 30 (connector width direction), a plurality of locking walls 54 projecting from this outer wall 52 into the respective terminal accommodating chambers, and a pair of left and right side walls 56 as shown in FIG. 3.

On the other hand, the ceiling wall 41 and the bottom wall 42 are respectively formed with retainer mounting holes 41a, 42a shaped to penetrate through the ceiling wall 41 and the bottom wall 42 in the thickness direction and extend across in the width direction. In a state where each terminal 30 is inserted in each terminal accommodating portion 45, the outer walls 52 of the retainers 50A, 50B are mounted into the retainer mounting holes 41a, 42a from outer sides, whereby the locking walls 54 are located behind the board contact portions 31 to prevent the detachment thereof.

These retainers 50A, 50B are not essential in the present invention. Further, the conductors for connection 14 may not necessarily be arranged on the both sides of the circuit board 10 and may be formed only on one of them. In that case, the terminals 30 may be arranged only in one row in the terminal holding portion 40.

Next, an assembling procedure of this electronic circuit unit is described.

Figure 2:
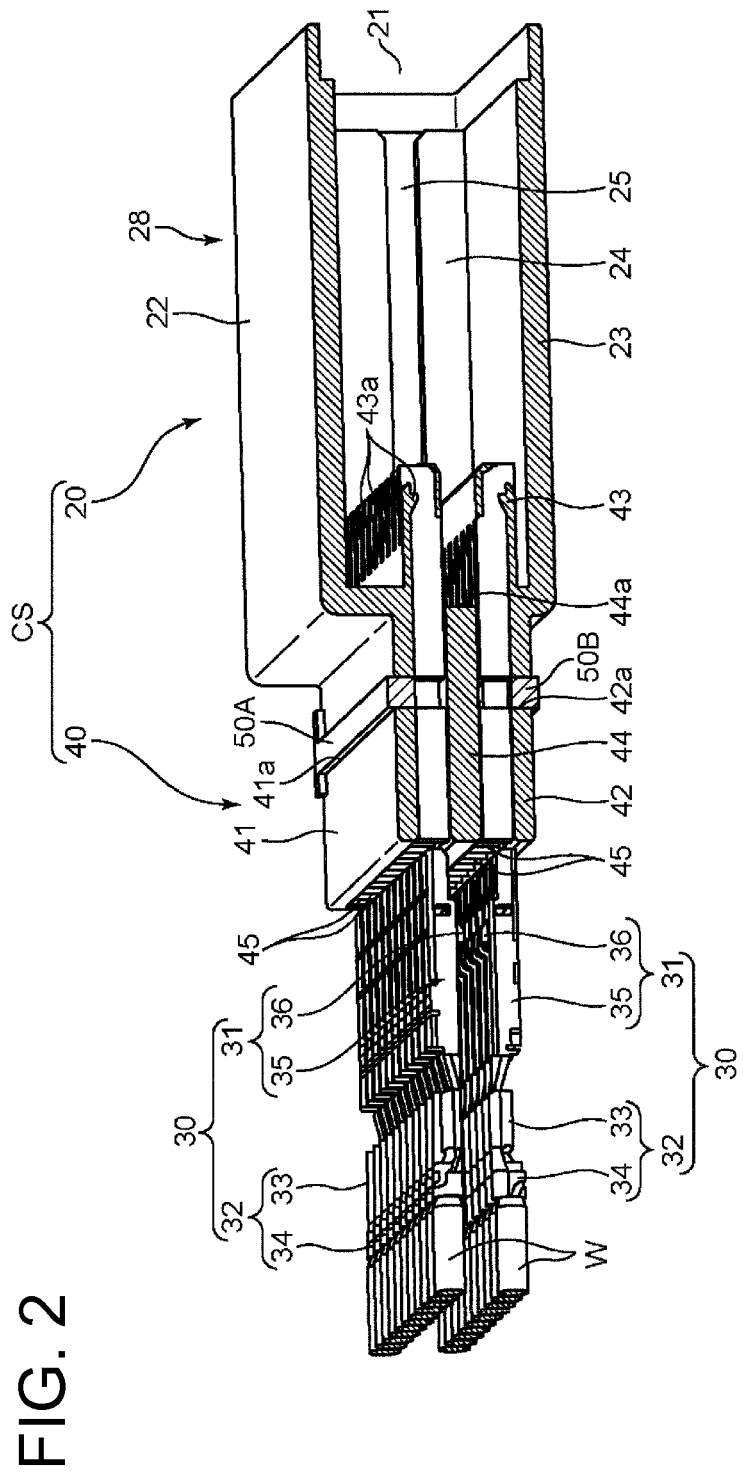
FIG. 2 is a perspective view in section showing a state before each terminal is inserted into each terminal accommodating chamber of a terminal holding portion of the case in the electronic circuit unit.

1) Insertion of the Terminals 30 into the Terminal Holding Portion 40 (FIGS. 2 and 6)

Each terminal 30 is inserted into each terminal accommodating chamber 45 of the terminal holding portion 40 from outside to the inside of the case CS in a state where the retainers 50A, 50B are mounted in the retainer mounting holes 41a, 42a of the ceiling wall 41 and the bottom wall 42 and located at a partial locking position. The locking lances 43 in the terminal holding portion 40 are engaged with the inserted terminals 30 to lock the terminals 30 (primary locking). In this way, the respective terminals 30 are arranged in two upper and lower rows and held in the common terminal holding portion 40 in such postures that the resilient contact pieces 36 thereof face inward.

2) Double Locking by the Retainers 50A, 50B (FIG. 3)

The retainers 50A, 50B are pushed from the partial locking position to a full locking position further inward than the partial locking position in the terminal holding portion 40. In this way, the retainers 50A, 50B doubly lock the respective terminals 30.

Figure 4:
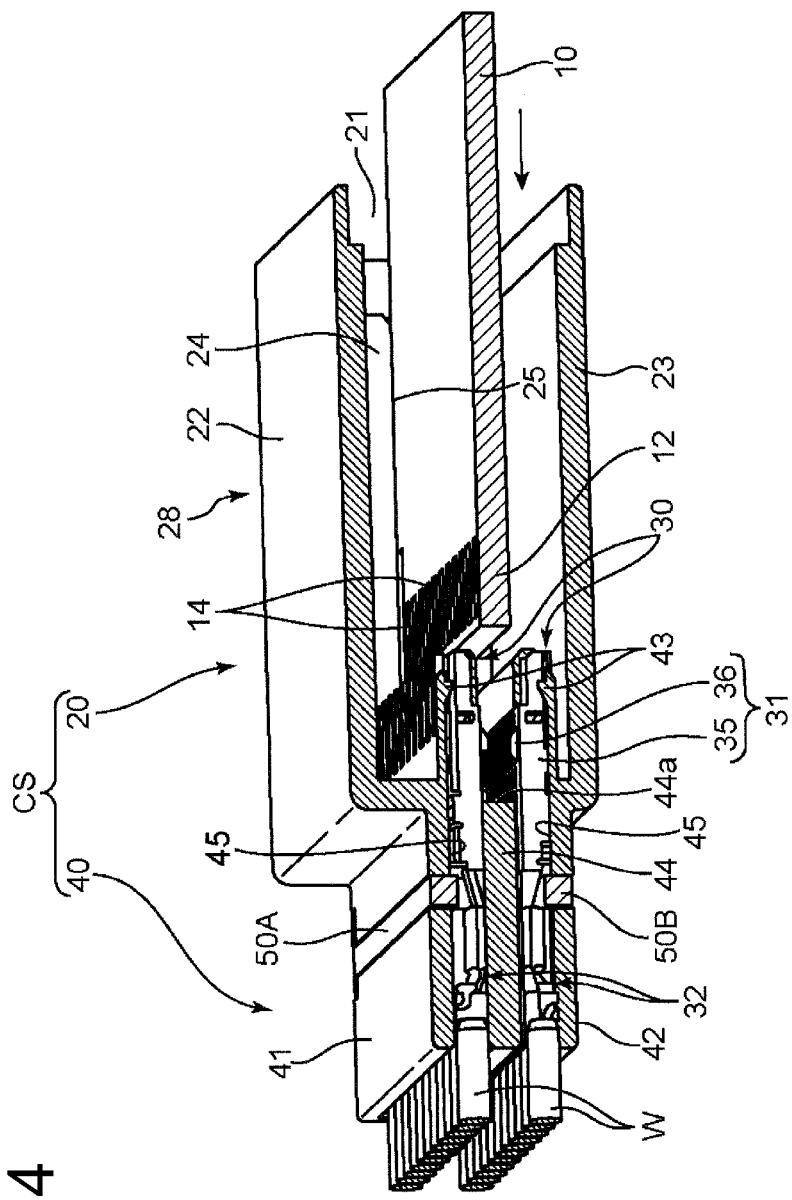
FIG. 4 is a perspective view in section showing a process of inserting the circuit board into a board housing portion of the case.

3) Insertion of the Circuit Board 10 into the Board Housing Portion 20 (FIG. 4)

In parallel with or before or after the processes 1) and 2), the circuit board 10 is inserted into the main body 28 of the board housing portion 20 in the case CS through the opening 21. This insertion is made with the lid portion 26 removed from the main body 28. The circuit board 10 is precisely inserted in the board inserting direction while being guided by the guiding grooves 25 of the side walls 24, and reaches a position where the edge part 12 thereof on a front side in the inserting direction comes into contact with the front end 44a of the intermediate wall 44 of the terminal holding portion 40, i.e. the board holding position. In this way, a state is reached where the respective conductors for connection 14 provided on the opposite surfaces of the edge part 12 simultaneously come into contact with the resilient contact pieces 36 of the respective terminals 30.

Figure 5:
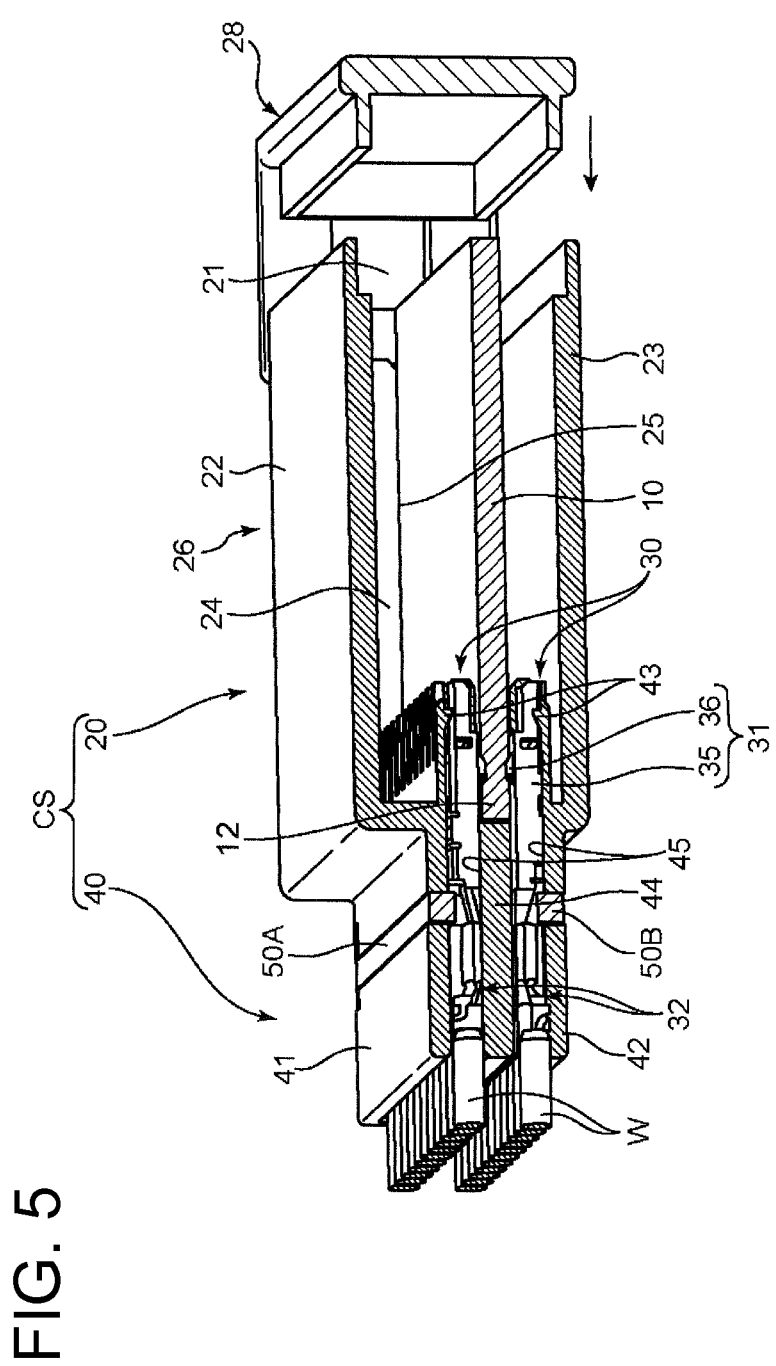
FIG. 5 is a perspective view in section showing a process of attaching a lid portion to a main body of the board housing portion into which the circuit board are inserted.

4) Attachment of the Lid Portion 26 (FIG. 5)

The lid portion 26 is so attached to the main body 28 to close the opening 21. During this attachment, the lid portion 26 comes into contact with or comes very close to an edge part 16 of the circuit board 10 opposite to the edge part 12. As a result, the circuit board 10 is fixed at the board holding position. Specifically, the circuit board 10 is sandwiched between the lid portion 26 and the front end 44a of the intermediate wall 44 of the terminal holding portion 40 in the board inserting direction and held by the left and right side walls 24 in the plate thickness direction, with the result that the circuit board 10 is fixed at the board holding position. Thus, the contact of each conductor for connection 14 of the circuit board 10 at the board holding position and the resilient contact piece 36 of each terminal 30 held in the terminal holding portion 40 is guaranteed.

As just described, in this electronic circuit board, by forming the case CS with the terminal holding portion 40, i.e. utilizing this case CS as a connector housing for holding the terminals 30, high connection reliability can be ensured while the structure is miniaturized and simplified as compared with a unit which has to use both a terminal-side housing and a board-side housing as before.

In this embodiment, since the circuit board 10 is fixed at the board holding position by being sandwiched between the lid portion 26 and the intermediate wall 44, the case CS does not particularly require a mechanism for locking the circuit board 10. However, in the present invention, the case CS may include a mechanism for actively locking the circuit board 10 in position. In such a case, the terminal holding portion 40 needs not necessarily include the board restraining portion that comes into contact with the edge part 12, and it is sufficient to guarantee the contact of each terminal 30 and each conductor for connection 14 of the circuit board 10 at the position where the terminal holding portion 40 is locked to the case CS.

In the above assembling procedure, each terminal 30 may be inserted into each terminal accommodating chamber 45 from behind with the circuit board 10 held in the board housing portion 20 in advance.

Figure 7:
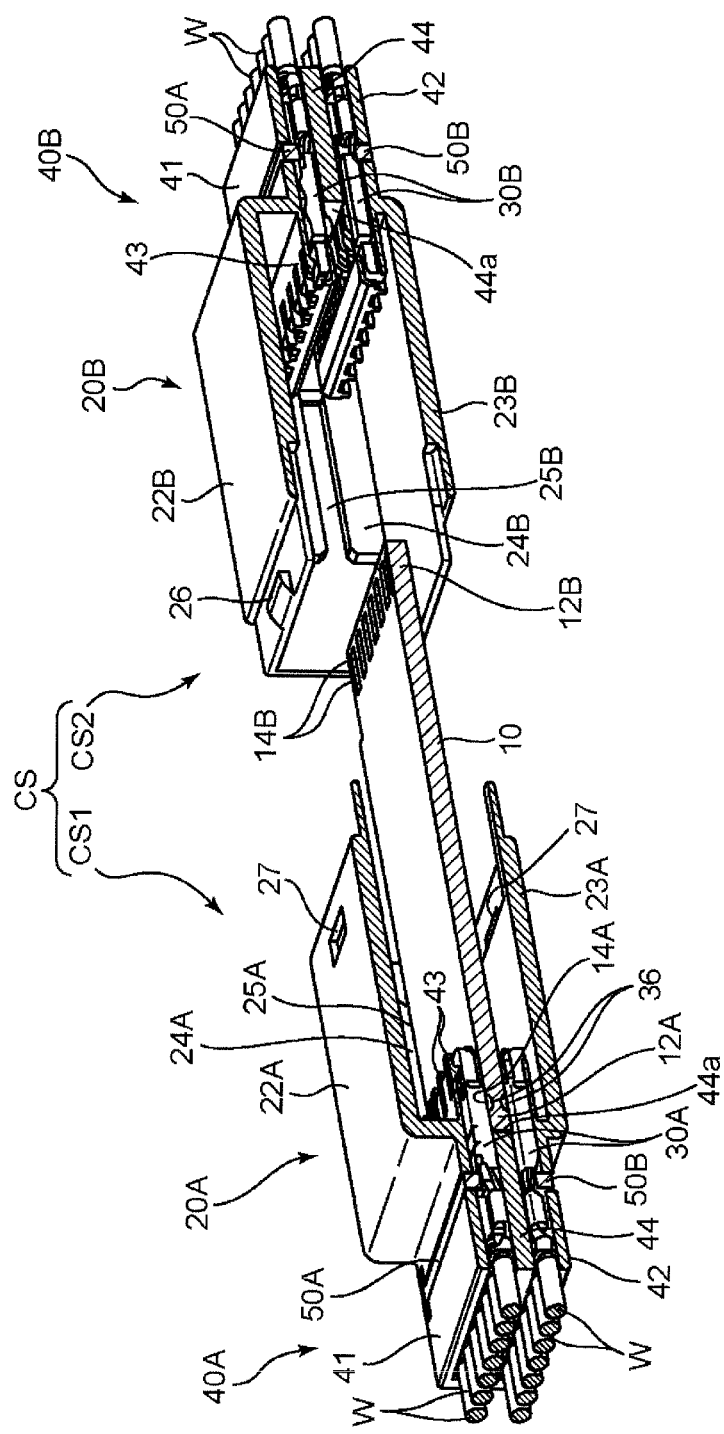
FIG. 7 is a perspective view in section showing a state before both case members are united in an electronic circuit unit according to a second embodiment of the present invention.
Figure 8:
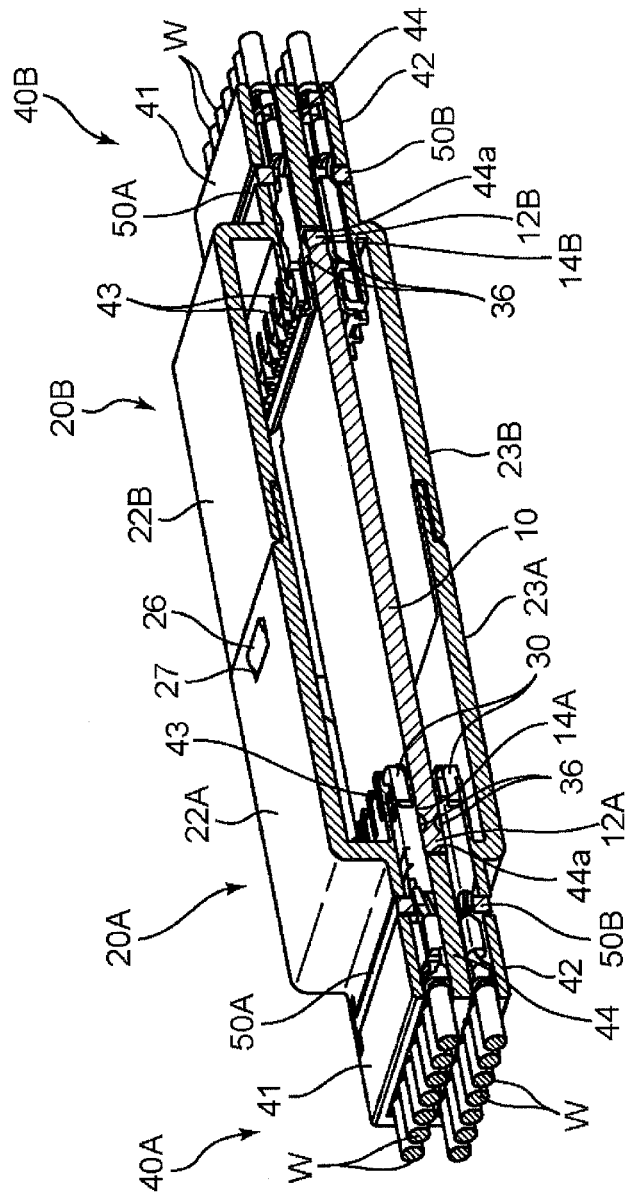
FIG. 8 is a perspective view in section showing a state where the case members are united.
Figure 9:
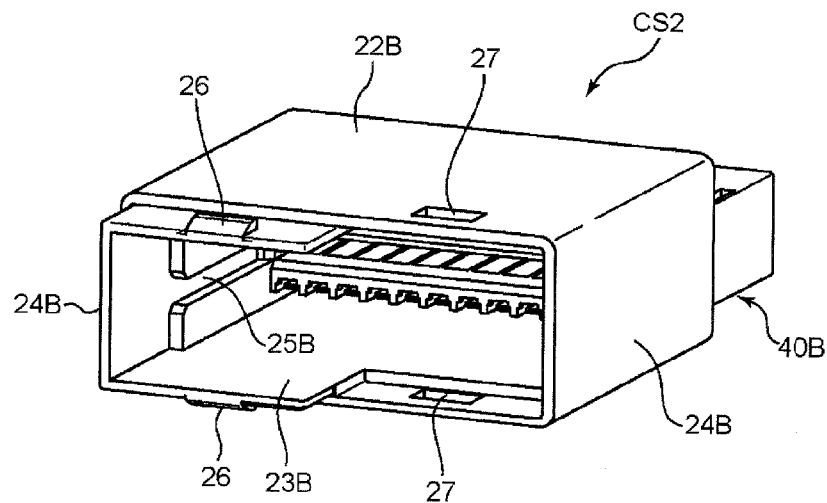
FIG. 9 is a perspective view showing an internal structure of one of the both case members.

Next, a second embodiment of the present invention is described mainly with reference to FIGS. 7 to 9.

An electronic circuit unit according to this embodiment includes a circuit board 10, a case CS for housing the circuit board 10, and first terminals 30A and second terminals 30B for connecting a plurality of wires W to the circuit board 10.

The circuit board 10 is, for example, a printed circuit board, conductor patterns for circuit configuration are arranged on both sides thereof, and electronic components constituting circuits are mounted thereon. The circuit board 10 according to this embodiment has a rectangular shape. A plurality of first conductors for connection 14A and a plurality of second conductors for connection 14B in the form of thin plates are respectively provided on the top surface and the under surface of each of a first edge part 12A and a second edge part 12B (left and right edge parts in FIGS. 7 to 9) on opposite sides of the circuit board 10 in a specific direction. These conductors for connection 14A, 14B are arranged along the edge parts 12A, 12B.

The case CS is made of an insulating material such as plastic. In this embodiment, the case CS is divided into a first case member CS1 for housing the first edge part 12A side of the circuit board 10 and a second case member CS2 housing the second edge part 12B side. The first case member CS1 includes a first board housing portion 20A and a first terminal holding portion 40A, and the second case member CS2 includes a second board housing portion 20B and a second terminal holding portion 40B.

Each board housing portion 20A, 20B is shaped to be open toward the mating board housing portion and to allow a corresponding half of the circuit board 10 to be inserted thereinto in a board inserting direction perpendicular to a plate thickness direction of the circuit board 10. Specifically, in an example shown in FIG. 7, the first board housing portion 20A receives the insertion of a left half (half on the side of the first edge part 12A) of the circuit board 10 and the second board housing portion 20B receives the insertion of a right half (half on the side of the second edge part 12B) of the circuit board 10.

The first board housing portion 20A includes a ceiling wall 22A, a bottom wall 23A and a pair of left and right side walls 24A. Similarly, the second board housing portion 20B includes a ceiling wall 22B, a bottom wall 23B and a pair of left and right side walls 24B. The ceiling wall 22A, 22B and the bottom wall 23A, 23B are arranged on upper and lower sides in postures parallel to each other. The both side walls 24A are arranged between the ceiling wall 22A and the bottom wall 23A and form a rectangular tube body together with the ceiling wall 22A and the bottom wall 23A. Similarly, the both side walls 24B are arranged between the ceiling wall 22B and the bottom wall 23B and form a rectangular tube body together with the ceiling wall 22B and the bottom wall 23B.

As shown in FIG. 9, on each of upper and lower edge parts on an opening side of each board housing portion 20A, 20B, a locking projection 26 projecting outward from the edge part and an engaging hole 27 penetrating through the edge part are juxtaposed in a lateral direction. Each locking projection 26 is shaped to be fittable into and engageable with the engaging hole 27 of the mating board housing portion. The both case members CS1, CS2 are held in a united state (FIG. 8) by engaging the locking projections 26 and the engaging holes 27 of the first board housing portion 20A and the engaging holes 27 and the locking projections 26 of the second board housing portion 20B with each other.

Guiding grooves 25A, 25B are formed at the same height position in the inner surfaces of the respective side walls 24A, 24B. The respective guiding grooves 25A, 25B extend in the board inserting direction and have such a width that left and right edge parts of the circuit board 10 are insertable thereinto. By the insertion of the circuit board 10 into the board housing portion 20A, 20B associated with this insertion, the left and right edge parts of the circuit board 10 are held from both sides (upper and lower sides in this embodiment) by the both side walls 24, i.e. sandwiched from both sides in the plate thickness direction of this circuit board 10.

Each of the first and second terminals 30A, 30B is mounted on an end of the corresponding wire W. The shapes and structures of these terminals 30A, 30B are not described since being the same as those of the terminals 30 according to the first embodiment.

The first terminal holding portion 40A is located on a side of the first board housing portion 20A opposite to the opening of the first board housing portion 20A and integrally formed to the first board housing portion 20A. The terminal holding portion 40A collectively holds the first terminals 30A in such an arrangement that resilient contact pieces 36 of the respective first terminals 30A simultaneously come into contact with the first conductors for connection 14A on the opposite surfaces of the first edge part 12A of the circuit board 10. Similarly, the second terminal holding portion 40B is located on a side of the second board housing portion 20B opposite to the opening of the second board housing portion 20B and integrally formed to the second board housing portion 20B. The terminal holding portion 40B collectively holds the second terminals 30B in such an arrangement that resilient contact pieces 36 of the respective second terminals 30B simultaneously come into contact with the second conductors for connection 14B on the opposite surfaces of the second edge part 12B of the circuit board 10.

Specifically, each terminal holding portion 40A, 40B includes a pair of upper and lower ceiling wall 41 and bottom wall 42 extending in parallel to each other, an intermediate wall 44 located between these ceiling wall 41 and bottom wall 42, and a pair of left and right side walls 46. A plurality of terminal accommodating chambers 45 juxtaposed in a lateral direction are formed between the ceiling wall 41 and the intermediate wall 44 and between the bottom wall 42 and the intermediate wall 44. Each terminal accommodating portion 45 is shaped to allow the corresponding terminal 30 to be inserted from the outside to the inside of the case CS and the resilient contact piece 36 of the terminal 30 to face the board housing portion 20.

Each intermediate wall 44 is located at the same height as the respective guiding grooves 25A, 25B. A front end (left end in the first terminal holding portion 40A, right end in the second terminal holding portion 40B in FIG. 7) 44a of the intermediate wall 44 is located behind the front ends of the ceiling wall 41 and the bottom wall 42, and a board insertion space into which the corresponding edge part 12A, 12B of the circuit board 10 is insertable is ensured before the front end 44a of the intermediate wall 44. Each terminal 30A, 30B is so held in the terminal holding portion 40A, 40B that the resilient contact piece 36 of the terminal 30A, 30B faces the board insertion space.

Specifically, the terminals 30A, 30B accommodated in the terminal accommodating chambers between the ceiling wall 41 and the intermediate wall 44 (terminals 30A in an upper row) are so held in the terminal holding portion 40A and 40B that the resilient contact pieces 36 thereof face downward, and the terminals 30A, 30B accommodated in the terminal accommodating chambers between the bottom wall 42 and the intermediate wall 44 (terminals 30A, 30B in a lower row) are so held in the terminal holding portion 40A, 40B that the resilient contact pieces 36 thereof face upward. Thus, the intermediate wall 44 is interposed between a group of the upper terminals 30A, 30B and a group of the lower terminals 30A, 30B.

The respective case members CS1, CS2 are so dimensioned that the edge parts 12A, 12B of the circuit board 10 are completely inserted into the respective board insertion spaces and end surfaces of the edge parts 12A, 12B come into contact with the front ends 44a of the respective intermediate walls 44 when the case members CS1, CS2 are united with each other, and holding positions of the respective terminals 30A, 30B in the respective terminal holding portions 40A, 40B are so set that the resilient contact pieces 36 of the respective terminals 30A, 30B simultaneously come into contact with the respective conductors for connection 14A, 14B of the circuit board at this time.

That is, the front ends 44a of the intermediate walls 44 of the both terminal holding portions 40A, 40 sandwich the circuit board 10 from both sides in the board inserting direction between the front ends 44a, and this sandwiching position corresponds to a proper "board holding position". In other words, a dimension of the circuit board 10 in the board inserting direction is set substantially equal to a distance between the front ends 44a of the both intermediate walls 44 when the case members CS1, CS2 are united with each other. Thus, the front ends 44a of the intermediate walls 44 in the terminal holding portions 40A, 40B respectively constitute a "first board restraining portion" and a "second board restraining portion".

Each terminal holding portion 40A, 40B includes a plurality of locking lances (terminal locking portions) 43 for holding each terminal 30A, 30B, and retainers 50A, 50B for doubly locking the terminals 30A 30B are respectively added. The structures of these locking lances 43 and the retainers 50A, 50B are not described since being equivalent to those of the first embodiment.

Also in the second embodiment, the retainers 50A, 50B are not essential. Further, the conductors for connection 14A, 14B may not necessarily be arranged on the both sides of the circuit board 10 and may be formed only on one of them.

In this embodiment, the shape and structure of the first case member CS1 and those of the second case member CS2 are set to be identical. However, they may be different from each other.

Next, an assembling procedure of this electronic circuit unit is described.

1) The terminals 30A, 30B are inserted into the terminal holding portions 40A, 40B and doubly locked by the retainers 50A, 50B. These movements are not described since being equivalent to the insertion of the terminals 30 into the terminal holding portion 40 and the double locking of the terminals 30 by the retainers 50A, 50B in the first embodiment.

2) Insertion of the Circuit Board 10 into the First Board Housing Portion 20A (FIG. 7)

In parallel with or before or after the processes 1) and 2), the circuit board 10 is inserted into the first board housing portion 20A of the first case member CS1 through the opening of the first board housing portion 20A with the first edge part 12A in the lead. Specifically, the circuit board 10 is precisely inserted in the board inserting direction while being guided by the guiding grooves 25A of the side walls 24A of the first board housing portion 20A, and the first edge part 12A in the lead reaches a position where the first edge part 12A comes into contact with the front end 44a of the intermediate wall 44 of the first terminal holding portion 40A. In this way, a state is reached where the respective first conductors for connection 14A provided on the opposite surfaces of the first edge part 12A simultaneously come into contact with the resilient contact pieces 36 of the respective first terminals 30A.

3) Uniting of the Case Members CS1, CS2 Associated with the Insertion of the Circuit Board 10 into the Second Board Housing Portion 20B (FIG. 8)

Similarly to the above, the circuit board 10 is inserted into the second board housing portion 20B of the second case member CS2 through the opening of the board housing portion 20B with the second edge part 12B in the lead. Associated with this insertion, the case members CS1, CS2 are united. This united state is maintained by the engagement of the locking projections 26 and the engaging holes 27 of the first case member CS1 and the engaging holes 27 and the locking projections 26 of the second case member CS2. By this uniting, the circuit board 10 is sandwiched between the front ends 44a of the intermediate walls 44 in the both terminal holding portions 40A, 40B in the board inserting direction and fixed at that position, i.e. at the board holding position. As a result, the simultaneous contact of the conductors for connection 14A, 14B on the respective edge parts 12A, 12B and the resilient contact pieces 36 of the terminals 30A, 30B held in the respective terminal holding portions 40A, 40B is guaranteed.

In this second embodiment, since the conductors for connection 14A, 14B are provided on the opposite edge parts 12A, 12B of the circuit board 10 and the first and second terminals 30A, 30B respectively come into contact therewith, the number of the wires W connectable to the circuit board 10 is doubled as compared with the first embodiment. In addition, since the circuit board 10 can be fixed at the board holding position without requiring the "lid portion 26" according to the first embodiment, the number of connectable wires can be increased by a rational structure.

Also in this second embodiment, the terminals 30A, 30B may be inserted later into the terminal accommodating chambers 45 of the terminal holding portions 40A, 40B in a state where the case members CS1, CS2 are united and the circuit board 10 is held in advance in the board housing portions 20A, 20B of the case members CS1, CS2.

In the present invention including the second and first embodiments, it is preferable to prevent the circuit board 10 from being housed in a vertically inverted posture into the board housing portion 20 (first and second board housing portions 20A, 20B in the second embodiment). This prevention is achieved by a simple structure composed of, for example, a combination of an inverted insertion preventing member fixed on one surface of the circuit board 10 in such a manner as to project from this surface and an insertion preventing portion provided in the case CS (case member accommodating the inverted insertion preventing member out of the first and second case members CS1, CS2 in the second embodiment) and configured to prevent the circuit board 10 from being completely inserted (prevent the both cases CS1, CS2 from being united with each other in the second embodiment) by coming into contact with the inverted insertion preventing member only when the circuit board 10 is vertically inverted.

Figure 10:
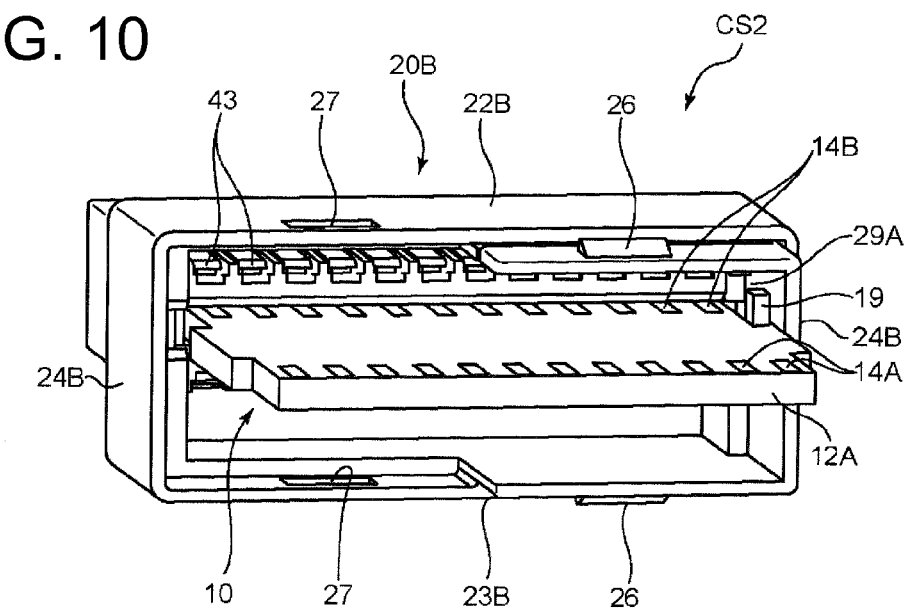
FIG. 10 is a perspective view showing a state where a half of a circuit board is inserted in a second case member according to a third embodiment of the present invention.
Figure 11:
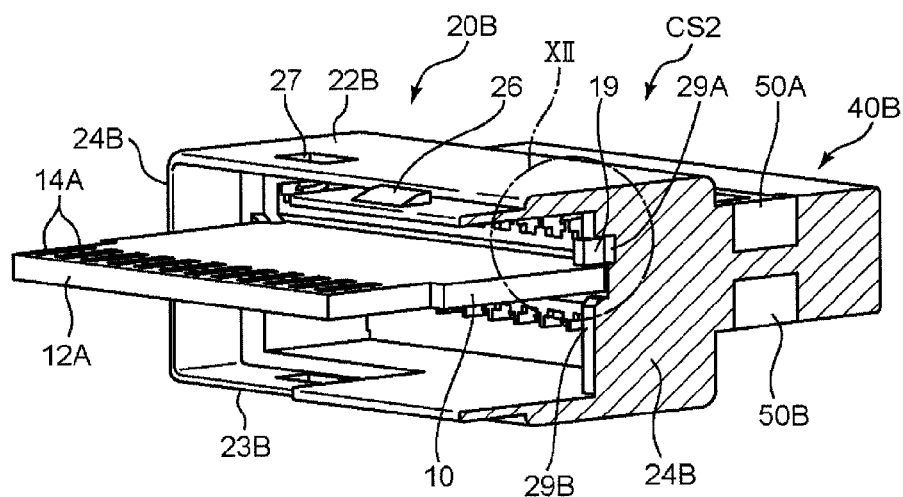
FIG. 11 is a perspective view in section showing the state of FIG. 10.
Figure 12:
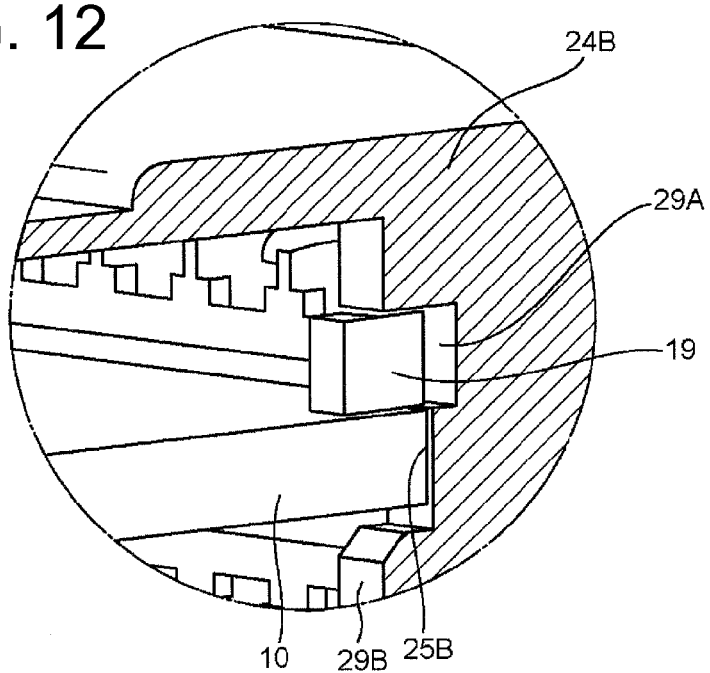
FIG. 12 is an enlarged view of a part XII of FIG. 11.
Figure 13:
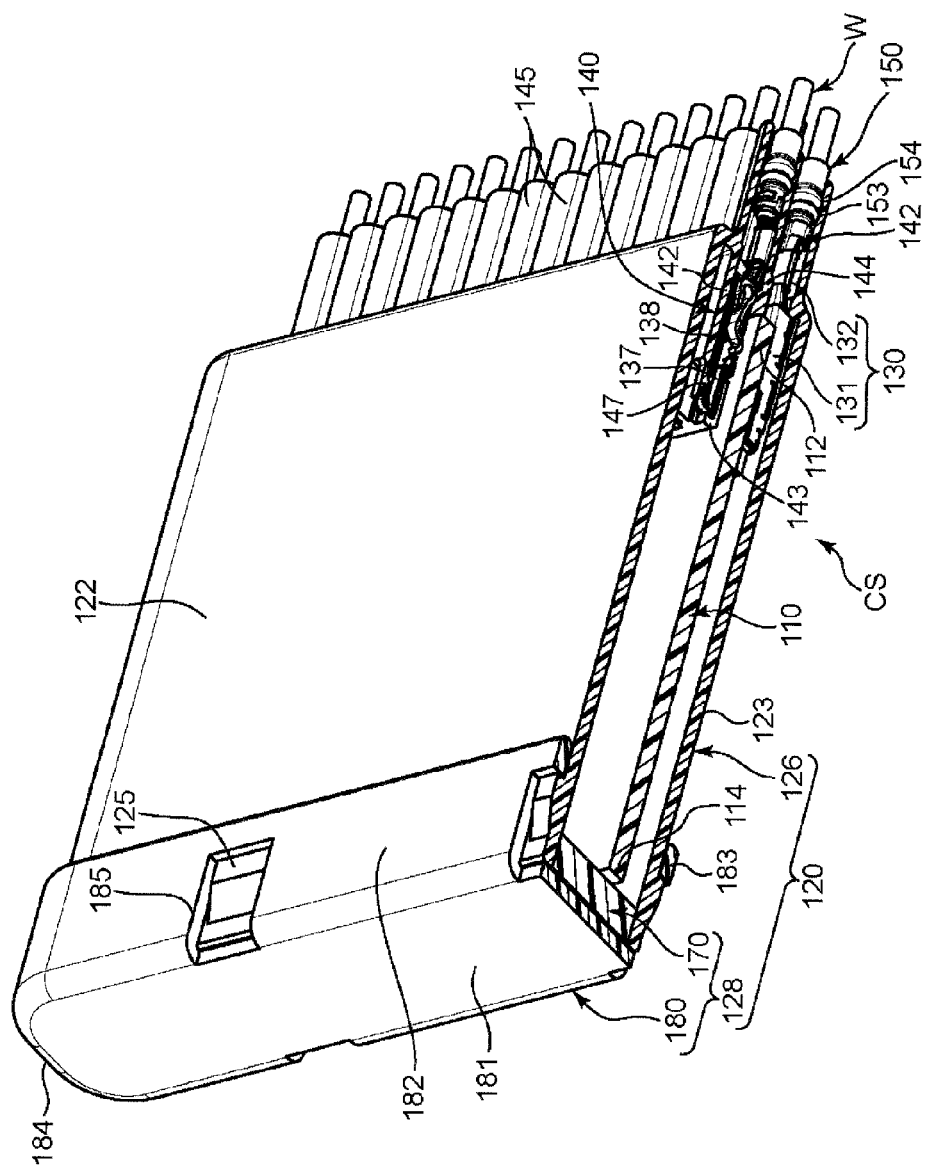
FIG. 13 is a perspective view in section showing a state where a circuit board, a case, terminals and wire-side waterproof members of an electronic circuit unit according to a fourth embodiment of the present invention are assembled.

This combination is described as a third embodiment with reference to FIGS. 10 to 12, taking an electronic circuit unit of the same type as the second embodiment as an example.

In a circuit board 10 of FIGS. 10 to 12, an inverted insertion preventing piece 19 is fixed on an upward facing surface when this circuit board 10 is in a proper posture, for example, by soldering. That fixed position is set at a position near a second edge part 12B and on one either one of left and right edge parts.

Contrary to this, an insertion allowing recess 29A and an insertion preventing wall 29B are vertically juxtaposed on a part of a side wall 24B of a second case member CS2 on the side of the inverted insertion preventing piece 19. The insertion allowing recess 29A is located right above a guiding groove 25B in the side wall 24B and receives the inverted insertion preventing piece 19 on the circuit board 10 (allow the insertion of the inverted insertion preventing piece 19 into the insertion allowing recess 29A) when the circuit board 10 is inserted in a proper posture into the guiding groove 25A, thereby allowing the circuit board 10 to be completely inserted into the second case member CS2 and the both case members CS1, CS2 to be united. On the other hand, the insertion preventing wall 29B is located right below the guiding groove 25B and comes into contact with the inverted insertion preventing piece 19 of the circuit board 10 when the circuit board 10 is inserted in a vertically inverted (upside-down) posture into the guiding groove 25B, thereby preventing the circuit board 10 from being completely inserted into the second case member CS2 and the both case members CS1, CS2 from being united.

This inverted insertion preventing structure can be similarly applied also in the first embodiment. For example, the inverted insertion preventing piece 19 projects at a position near the edge part 12 of the circuit board 10 shown in FIG. 4, an insertion preventing portion is provided in the board housing portion 20 of FIG. 4, and this insertion preventing portion has only to be set at such a position where the insertion preventing portion comes into contact with the inverted insertion preventing piece 19 before the edge part 12 is completely inserted when the circuit board 10 is inserted in an upside-down posture.

A fourth embodiment of the present invention is described with reference to FIGS. 13 to 18.

An electronic circuit unit according to this embodiment is a unit of a type similar to the electronic circuit unit of the first embodiment and has an additional waterproof function and includes a circuit board 110, a case CS for housing the circuit board 110, a plurality of terminals 130 for connecting a plurality of wires W to the circuit board 110 and wire-side waterproof members 150.

The circuit board 110 is, for example, a printed circuit board, conductor patterns for circuit configuration are arranged on both sides thereof, and electronic components constituting circuits are mounted thereon. The circuit board 110 according to this embodiment has a rectangular shape including an edge part 112 on one side (right side in FIGS. 13 and 14) thereof and an edge part 114 on a side opposite to the edge part 112 (left side in FIGS. 13 and 14). A plurality of conductors for connection in the form of thin plates equivalent to the conductors for connection 14 according to the first embodiment are provided on the top surface and the under surface of the edge part 112 and arranged along the edge part 112.

The case CS is entirely made of an insulating material such as plastic and includes a board housing portion 120, a plurality of terminal inserting portions 145 and a plurality of terminal holding portion 140.

The board housing portion 120 includes a main body 126 with an opening 121 which is open in a specific direction (leftward direction in FIGS. 13 and 14) and a lid portion 128 to be removably attached to this main body 126

The main body 126 is shaped to allow the circuit board 110 to be inserted in a board inserting direction (rightward direction in FIGS. 13 and 14 in this embodiment) perpendicular to a plate thickness direction of the circuit board 110 through the opening 121 with the edge part 112 in the lead. Specifically, the main body 126 includes a ceiling wall 122, a bottom wall 123, a pair of left and right side walls 124 and locking portions 125 formed on the ceiling wall 122 and the bottom wall 123. The ceiling wall 122 and the bottom wall 123 are arranged on upper and lower sides in postures parallel to each other. The both side walls 124 are arranged between the ceiling wall 122 and the bottom wall 123 and form a rectangular tube body together with the ceiling wall 122 and the bottom wall 123. The locking portions 125 are for locking a lid portion 128 and formed on parts of the ceiling wall 122 and the bottom wall 123 near the opening 121. The locking portions 125 according to this embodiment are respectively formed at a pair of positions juxtaposed in a direction connecting the both side walls 124.

The lid portion 128 is attached to the main body 126 to close the opening 121 of the main body 126 and seal the interior of the case CS. In this embodiment, the lid portion 128 includes an opening closing member 170 to be press-fitted into the opening 121 of the main body 126 and a cover member 180 to be removably attached to the main body 126 so as to cover the opening closing member 170.

The opening closing member 170 is made of a resiliently deformable and insulating material such as rubber and shaped to close the opening 121 of the main body 126 by being press-fitted into the opening 121 while being resiliently deformed. More specifically, this opening closing member 170 has an outer peripheral surface 171 to be held in close contact with an inner peripheral surface of the main body 126 defining the opening 121 over the entire circumference. Further, this opening closing member 170 is shaped to sandwich the circuit board 110 from both sides in the board inserting direction between a board restraining portion of the terminal holding portion 140 to be described later and the opening closing member 170.

Figure 14:
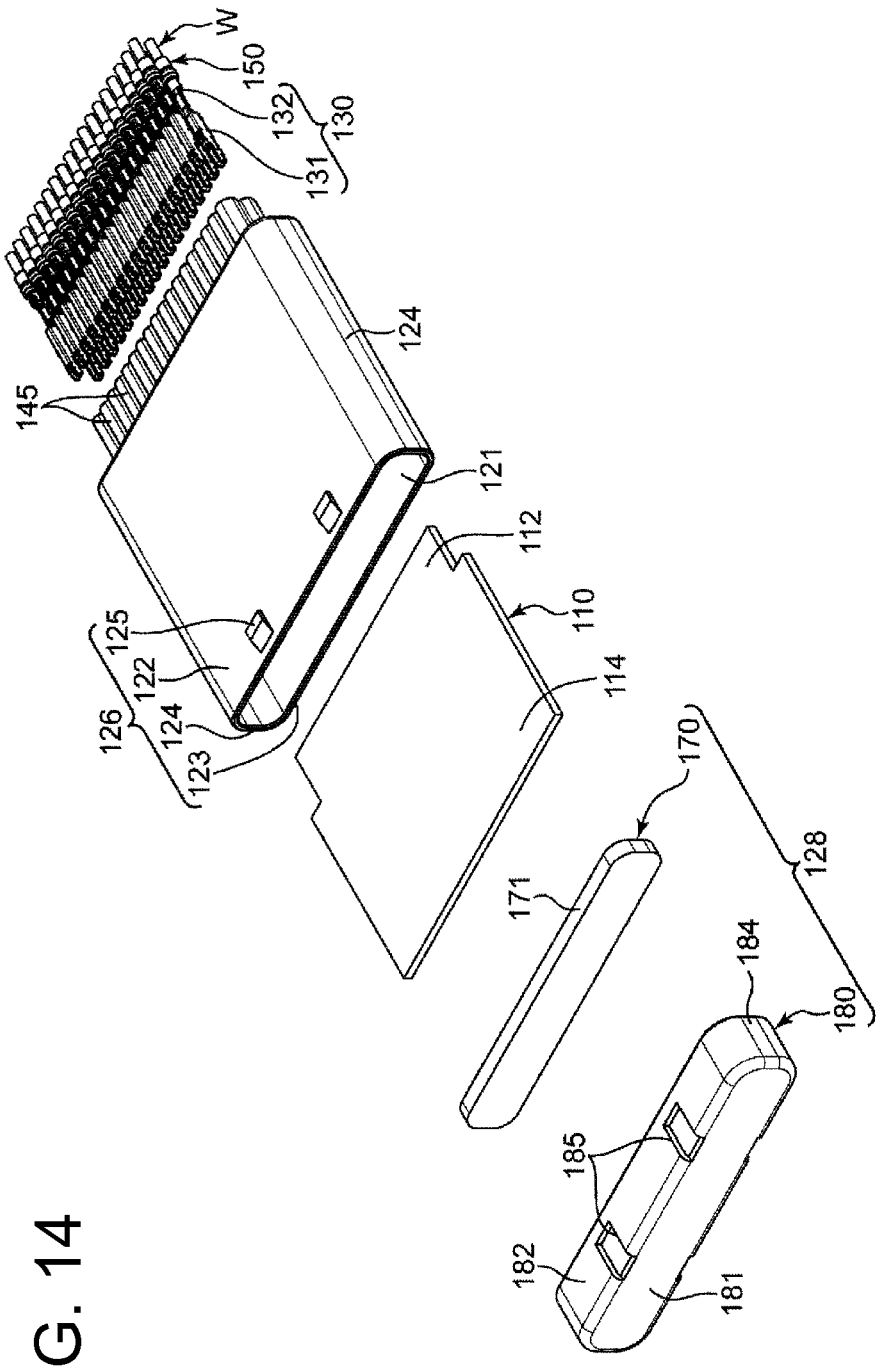
FIG. 14 is an exploded perspective view of the electronic circuit unit.

The cover member 180 is formed of an insulating material such as plastic, includes a main wall 181 for closing the opening 121 of the main body 126 and a peripheral wall integrally connected to the main wall 181 and configured to cover a peripheral edge part of the opening 121 of the main body 126 from an outer side, and the peripheral wall includes a ceiling plate portion 182 and a bottom plate portion 183 for respectively covering the ceiling wall 122 and the bottom wall 123 of the main body 126 and side plate portions 184 (only one side plate portion 184 is shown in FIG. 14) for covering the respective side walls 124 of the main body 126. Each of the ceiling plate portion 182 and the bottom plate portion 183 includes locked portions 185, which are respectively engaged with the locking portions 125 to hold a state where the cover member 180 is attached to the main body 126. Each locking portion 125 has such a tapered surface as to gradually increase a thickness along a direction in which the cover member 180 is attached.

Each terminal 130 is mounted on an end of the corresponding wire W. Each wire W is composed of an unillustrated conductor and an insulation coating covering the conductor. The insulation coating is partly removed at the end of the wire W to expose the conductor.

Figure 15:
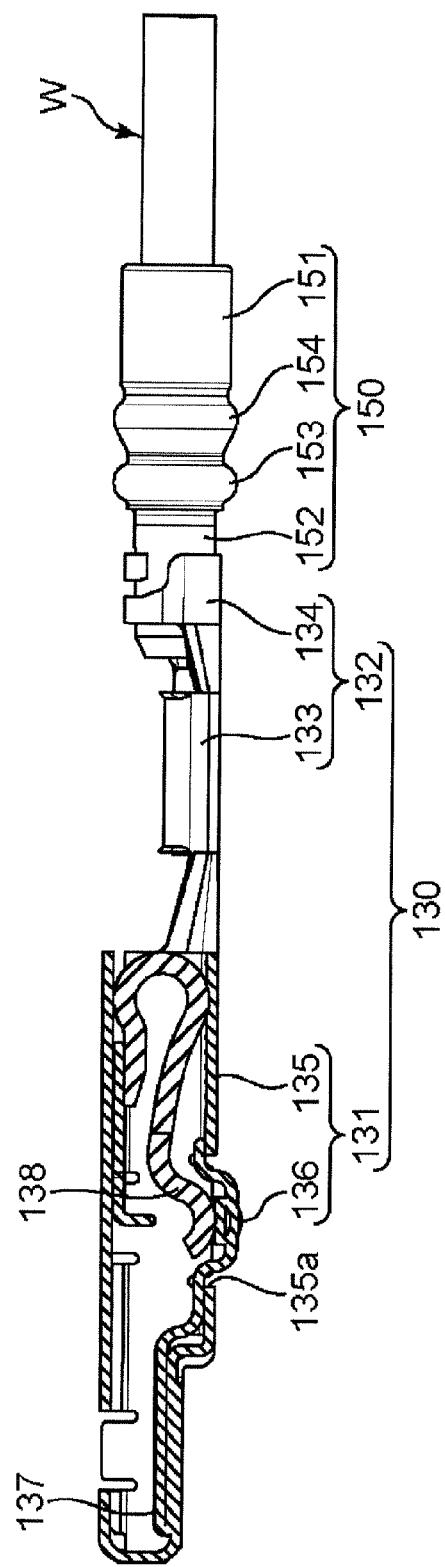
FIG. 15 is an enlarged view showing the terminal, a wire and the wire-side waterproof member in the electronic circuit unit in detail.

Each terminal 130 is made of an electrically conductive metal plate and mounted on the end of the corresponding wire W. Specifically, each terminal 130 includes a board contact portion 131 and a wire connecting portion 132 arranged one after the other as shown in FIG. 15. The wire connecting portion 132 includes left and right conductor barrels 133 and left and right insulation barrels 134 arranged one after the other. The both conductor barrels 133 are so crimped to the conductor as to embrace the conductor exposed at the end of the wire W, thereby being electrically conductively connected to the conductor. The both insulation barrels 134 are so crimped to the wire W via the wire-side waterproof member 150 as to embrace a front end part 152 of the later-described wire-side waterproof member 150 located behind the exposed part of the conductor and mounted on the end of the wire W.

The board contact portion 131 is composed of a box-shaped main body 135 extending in a terminal axial direction and a resilient contact piece 136 protruding in a direction perpendicular to the terminal axial direction from the main body 135. The main body 135 is integrally formed to the wire connecting portion 132 and obtained by forming a part of the metal plate forming the wire connecting portion 132 into a rectangular tube shape. A window 135*a* is formed to penetrate through one of four walls forming this main body 135. The resilient contact piece 136 protrudes in an arched manner from the inside of the main body 135 to the outside of the main body 135 through the window 135*a*. However, when coming into contact with the conductor for connection of the edge part 112 of the circuit board 110, this resilient contact piece 136 receives a reaction force from the edge part 112, is deflected and displaced to retract into the window 135*a* and is pressed into contact with the conductor for connection by a resilient force thereof. This resilient contact piece 136 is formed by bending a part of the metal plate forming the main body 135 and arranging the bent part to be exposed to the outside through the window 135*a*, and pivots with that bent portion 137 as a support point between a posture where the resilient contact piece 136 is exposed from the window 135*a* and a posture where the resilient contact piece 136 is retracted into the window 135*a*.

A biasing member 138 for biasing the resilient contact piece 136 in a direction to protrude from the window 135*a* from an inner side is provided in the main body 135. This biasing member 138 biases the resilient contact piece 136 to assist the press contact of the resilient contact piece 136 with the conductor for connection when the resilient contact piece 136 comes into contact with the conductor for connection.

The plurality of terminal inserting portions 145 are located on a side of the board housing portion 120 opposite to the opening 121 and integrally formed to the main body 126 of the board housing portion 120. Each terminal inserting portion 145 includes an inner peripheral surface surrounding a terminal insertion hole 149 through which the board contact portion 131 of the corresponding terminal 130 is insertable. Each terminal inserting portion 145 according to this embodiment has a cylindrical shape and includes a cylindrical inner peripheral surface surrounding the terminal insertion hole 149. These terminal inserting portions 145 are respectively formed at such positions that the board contact portions 131 of the terminals 130 inserted through the terminal insertion holes 149 surrounding the terminal inserting portions 145 from behind are directly accommodated into the terminal holding portions 140.

The plurality of terminal holding portion 140 are shaped to be able to receive each terminal 130 inserted through each terminal inserting portion 145 and holds each terminal 130 such that each board contact portion 131 and each conductor for connection of the circuit board 110 can come into contact with each other in a receiving state. These terminal holding portions 140 collectively hold the terminals 130 in such an arrangement that the resilient contact pieces 136 of the respective terminals 130 simultaneously come into contact with the conductors for connection on the opposite surfaces of the edge part 112 of the circuit board 110. These terminal holding portions 140 extend forward integrally from the terminal inserting portions 145.

Specifically, the terminal holding portion 140 according to this embodiment includes a front inner wall 143, a rear inner wall 144 spaced backward from the front inner wall 143, and a peripheral wall 142 surrounding these inner walls 143, 144, and a plurality of terminal accommodating chambers 141 for mainly holding the accommodated board contact portions 131 of the respective terminals 130 are formed between the both inner walls 143, 144 and the peripheral wall 142. The respective terminal accommodating chambers 141 are juxtaposed in the lateral direction between an upper part of the front inner wall 143 and the rear inner wall 144 and between a lower part of the front inner wall 143 and the rear inner wall 144. The front inner wall 143 surrounds a board insertion space into which the edge part 112 of the circuit board 110 is insertable from front, and the rear inner wall 144 is located behind the board insertion space. Each terminal 130 is held in the terminal holding portion 140 so that the resilient contact piece 136 thereof faces the board insertion space.

Specifically, the terminals 130 accommodated in the terminal accommodating chambers 141 between the upper part of the front inner wall 143 and the rear inner wall 144 (terminals 130 in an upper row) are so held in the terminal holding portion 140 that the resilient contact pieces 136 thereof face downward, and the terminals 130 accommodated in the terminal accommodating chambers 141 between the lower part of the front inner wall 143 and the rear inner wall 144 are so held in the terminal holding portion 140 that the resilient contact pieces 136 thereof face upward. The rear inner wall 144 is interposed between a group of the upper terminals 130 and a group of the lower terminals 130.

Holding positions of the respective terminals 130 in the terminal holding portion 140 are so set that the resilient contact pieces 136 of the terminals 130 simultaneously come into contact with the conductors for connection of the circuit board 110 at a position where the edge part 112 of the circuit board 110 is completely inserted into the board insertion space and the end surface of the edge part 112 comes into contact with a front end 144a of the rear inner wall 144. That is, the front end 144a of the rear inner wall 144 constitutes a "board restraining portion" for restraining the circuit board 110 in the board inserting direction, and restrains the circuit board 110 between the front end 144a and the later-described lid portion 128 attached to the main body 126 from both sides in the board inserting direction. A position where the circuit board 110 is restrained in this way corresponds to a proper "board holding position" according to this embodiment. In this embodiment, a dimension of the circuit board 110 in the board inserting direction is set substantially equal to a distance between the front end 144a of the rear inner wall 144 and the inner surface of the lid portion 128 attached to the main body 126.

The terminal holding portion 140 includes a plurality of locking lances (terminal locking portions) 147 for holding each terminal 130. Each locking lance 147 is deflected and displaced in a direction to be retracted from the terminal 130 when the terminal 130 is inserted into the terminal accommodating chamber 141 from the outside of the case CS (right side in FIG. 13) and locks an appropriate position of the terminal 130 by being resiliently restored when the insertion of the terminal 130 is completed.

The wire-side waterproof member 150 is provided for each wire W to seal the interior of the case CS. The wire-side waterproof member 150 according to this embodiment is provided for each wire W to seal each of the plurality of terminal inserting portions 145. Specifically, the entrance of water into the interior of the case CS is prevented by sealing each terminal inserting portion 145 by the wire-side waterproof member 150 and sealing the opening 121 of the main body 126 by the lid portion 128.

In this embodiment, each wire-side waterproof member 150 is made of a resiliently deformable and insulating material such as rubber and mounted on an end of each wire W. Each wire-side waterproof member 150 is shaped such that the wire-side waterproof member 150 can be press-fitted into the terminal inserting portion 145 and held in close contact with the inner peripheral surface of the terminal inserting portion 145 over the entire circumference while being resiliently deformed.

Specifically, as shown in FIG. 15, the wire-side waterproof member 150 includes a rear end part 151 on a side for receiving the end of the wire W, a front end part 152 provided on a side opposite to the side where the rear end part 151 is provided and to be clamped by the insulation barrels 134, and a first waterproof portion 153 and a second waterproof portion 154 shaped to be able to seal the terminal inserting portion 145 by the close contact of the outer peripheral surfaces thereof with the inner peripheral surface of the terminal inserting portion 145 over the entire circumference. The first and second waterproof portions 153, 154 are juxtaposed one after the other between the rear end part 151 and the front end part 152, and outer diameters thereof are set to seal the terminal inserting portion 145 by the press-fitting thereof into the terminal inserting portion 145. This wire-side waterproof portion 150 has a tubular shape, an insulated part of the wire W is exposed from an opening on the side of the rear end part 151 and a conductor of the wire W exposed by removing an insulation coating is exposed from an opening on the side of the front end part 152.

Next, an assembling procedure of this electronic circuit unit is described.

Figure 16:
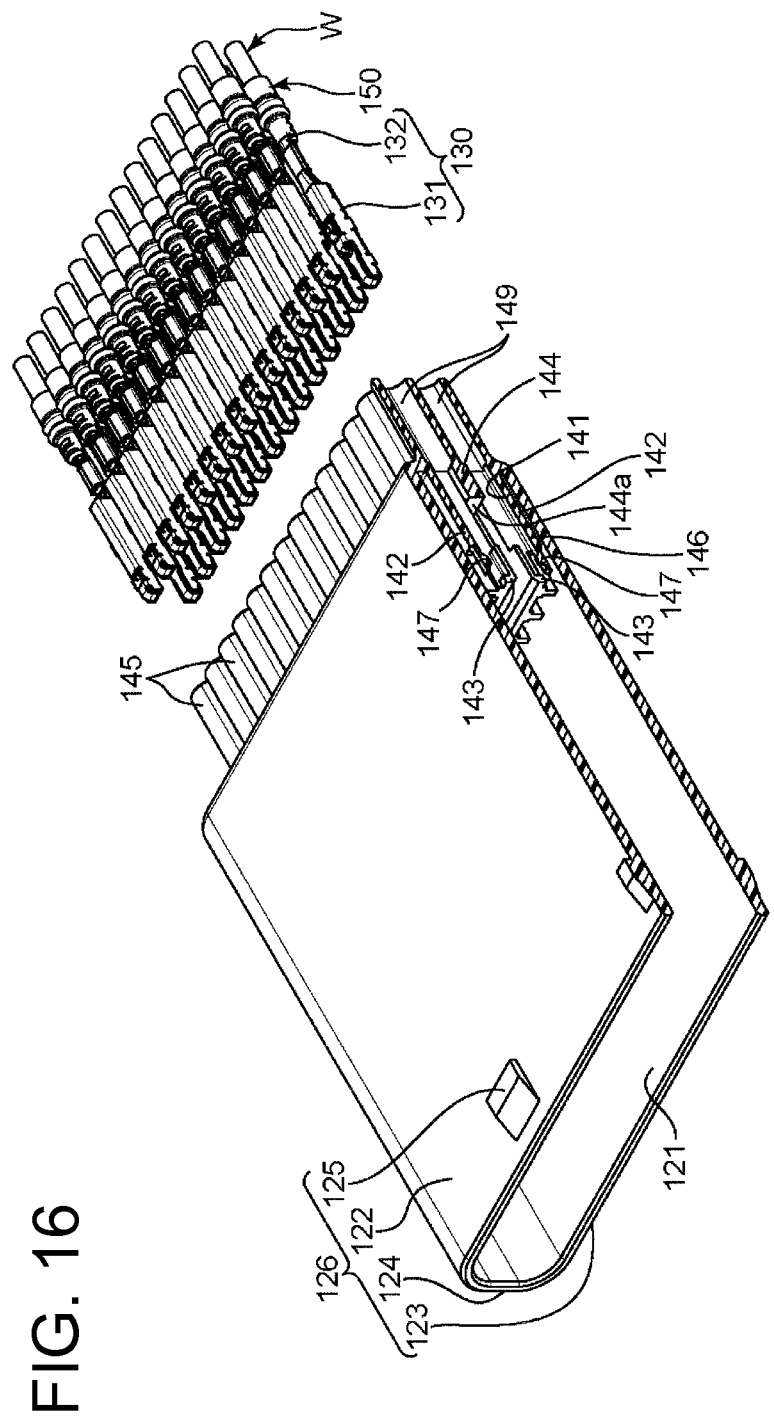
FIG. 16 is a perspective view in section showing a state before each terminal is inserted into each terminal accommodating chamber of a terminal holding portion of the case in the electronic circuit unit.

1) Insertion of the Terminals 130 into the Terminal Inserting Portions 145 and the Terminal Holding Portion 140 (FIG. 16)

The board contact portion 131 of each terminal 130 is inserted into each terminal insertion hole 149 of the terminal inserting portion 145 from behind. This board contact portion 131 is inserted into the terminal accommodating chamber 141 of the terminal holding portion 140 and locked by the locking lance 147. In this way, the respective terminals 130 are arranged in two upper and lower rows and held in the common terminal holding portion 140 in such postures that the resilient contact pieces 136 thereof face inward. At this time, the wire-side waterproof member 150 mounted on the wire W behind the terminal 130 is held in close contact with the inner peripheral surface of the terminal inserting portion 145 surrounding the terminal insertion hole 149 over the entire circumference, thereby providing sealing between the wire W and the terminal inserting portion 145. Specifically, waterproofing on the side of the wire W is performed.

Figure 17:
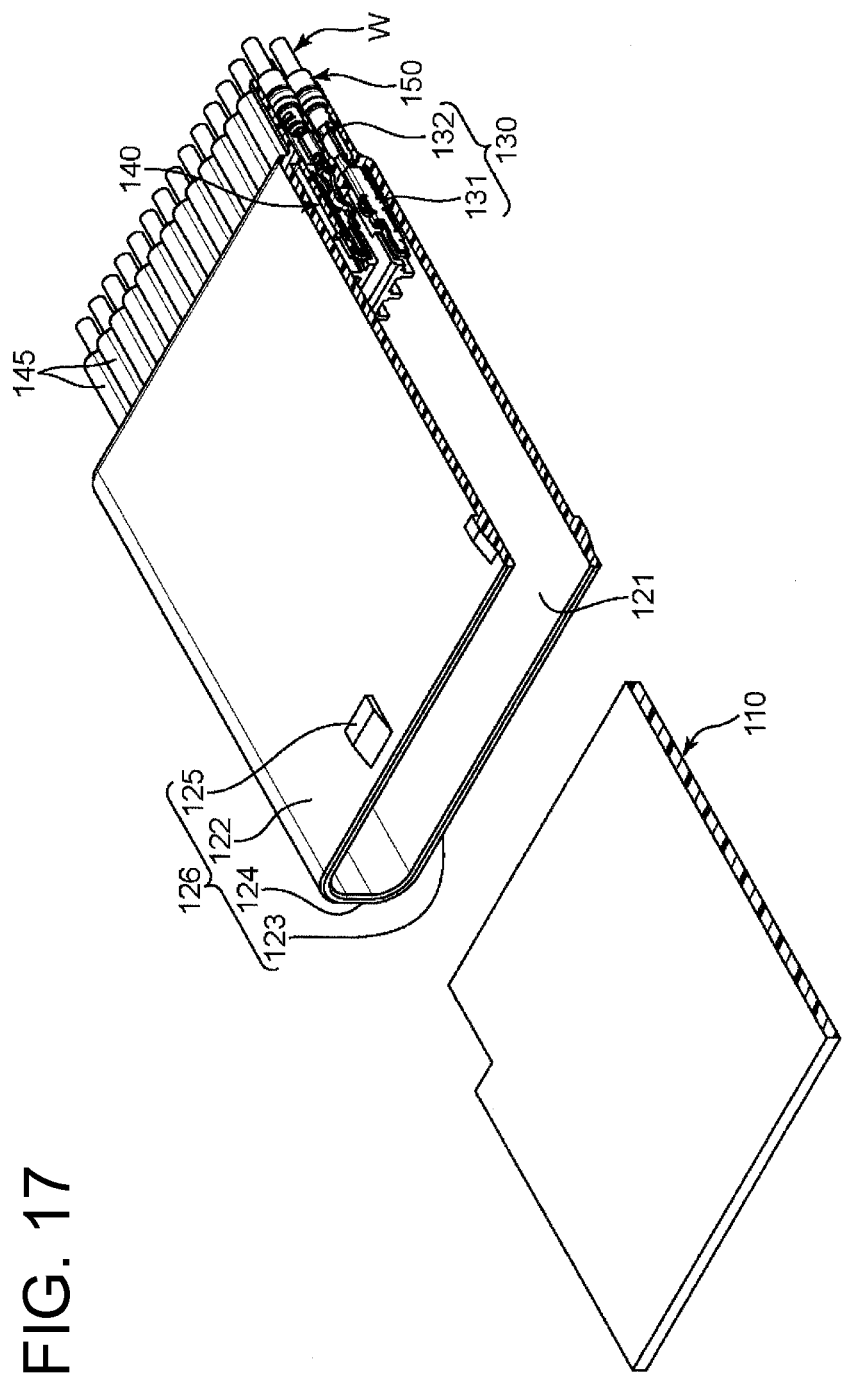
FIG. 17 is a perspective view in section showing a state before the circuit board is inserted into a board housing portion of the case.

2) Insertion of the Circuit Board 110 into the Board Housing Portion 120 (FIG. 17)

In parallel with or before or after the process 1), the circuit board 110 is inserted into the main body 128 of the board housing portion 120 in the case CS through the opening 121. This insertion is made with the lid portion 128 removed from the main body 126. The circuit board 110 is inserted up to a position where the edge part 112 thereof on a front side in the inserting direction comes into contact with the front end 144a of the rear inner wall 144 of the terminal holding portion 140, i.e. the board holding position. In this way, a state is reached where the respective conductors for connection provided on the opposite surfaces of the edge part 112 simultaneously come into contact with the resilient contact pieces 136 of the respective terminals 130.

Figure 18:
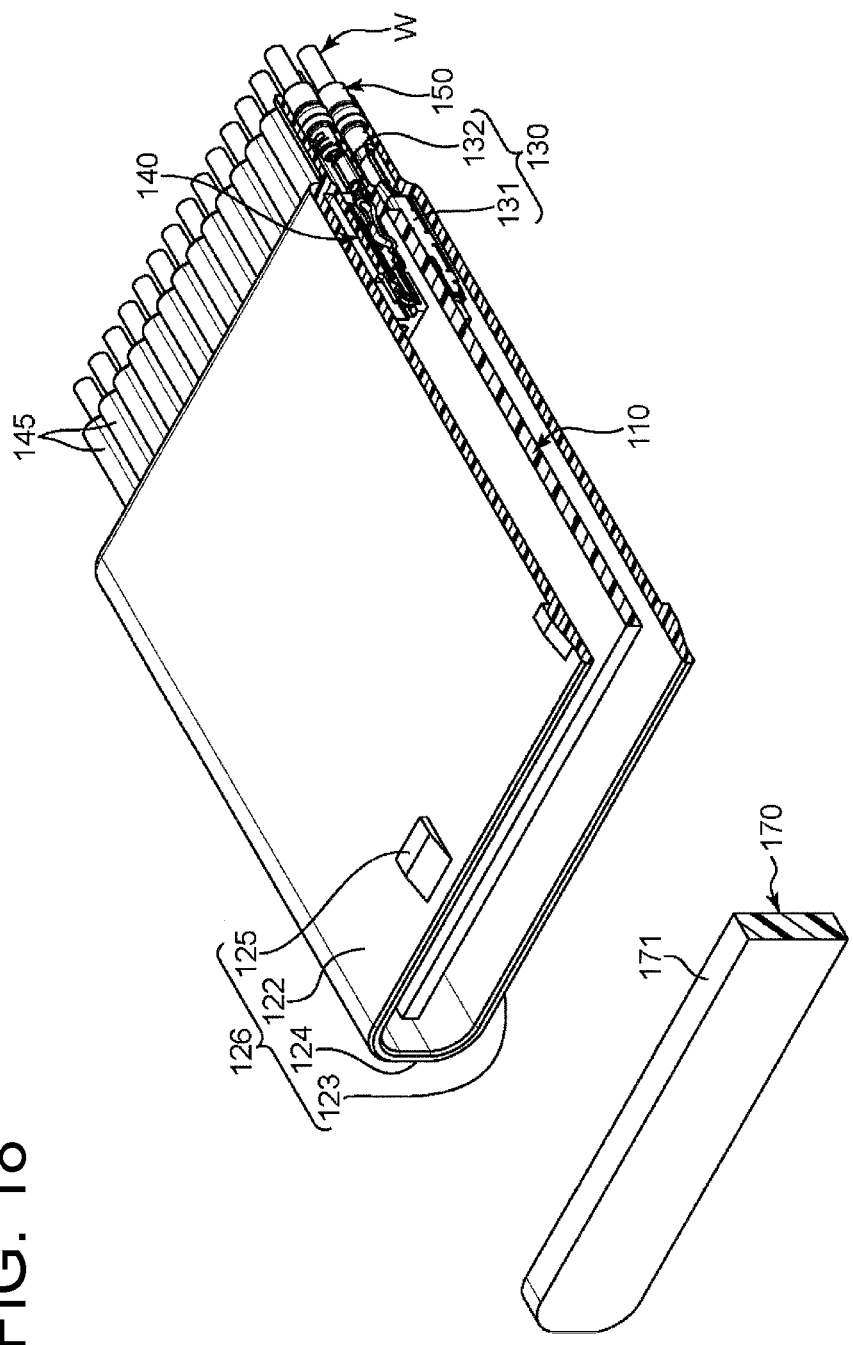
FIG. 18 is a perspective view in section showing a state before an opening of a main body of the board housing portion, into which the circuit board is inserted, is sealed by an opening closing member.

3) Press-Fitting of the Opening Closing Member 170 (FIG. 18)

The opening closing member 170 is press-fitted into the main body 126 to seal the opening 121. During this press-fitting, the opening closing member 170 comes into contact with or comes very close to the edge part 114 of the circuit board 110 opposite to the edge part 112. As a result, the circuit board 110 is fixed at the board holding position. Specifically, the circuit board 110 is sandwiched between the opening closing member 170 and the front end 144a of the rear inner wall 144 of the terminal holding portion 140 in the board inserting direction, with the result that the circuit board 110 is fixed at the board holding position. Thus, the contact of the respective conductors for connection of the circuit board 110 at the board holding position and the resilient contact pieces 136 of the respective terminals 130 held in the terminal holding portion 140 is guaranteed. At this time, the opening closing member 170 is held in close contact with the inner peripheral surface defining the opening 121 of the main body 126, thereby providing sealing between the opening closing member 170 and the main body 126. Specifically, waterproofing on the side of the lid portion 128 is performed.

Figure 19:
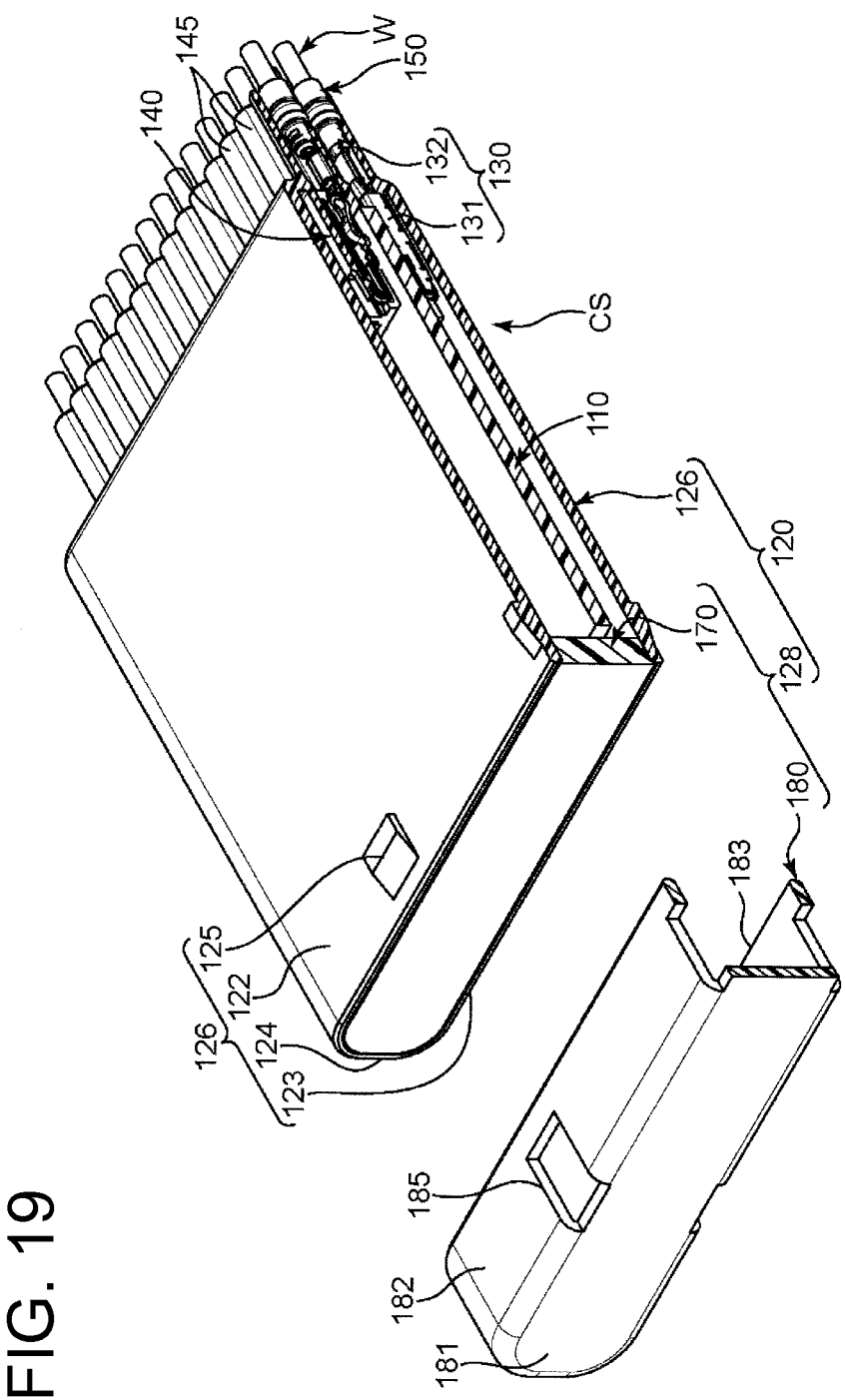
FIG. 19 is a perspective view in section showing a state before a cover member is attached to the main body whose opening is sealed by the opening closing member.

4) Attachment of the Cover Member 180 (FIG. 19)

The cover member 180 is attached to the main body 126 to cover the opening closing member 170. During this attachment, the inner surface of the main wall 181 of the cover member 180 comes into contact with or comes very close to an end surface of the main body 126 on the side where the opening 121 is provided. Simultaneously with this, the locking portions 125 of the main body 126 and the locked portions 185 of the cover member 180 are engaged. Note that this engagement is achieved as follows. The ceiling plate portion 182 and the bottom plate portion 183 of the cover member 180 are deflected and displaced in thickness directions of the tapered surfaces of the locking portions 125 while the inner surfaces thereof slide in contact with the tapered surfaces, and resiliently restored to eliminate displacements at a position where the locking portions 125 are moved over. Further, it is also possible to omit this cover member 180.

In the above assembling procedure, the terminals 130 may be inserted into the respective terminal inserting portions 145 and the terminal holding portion 140 at last. Specifically, after the insertion of the circuit board 110 into the board housing portion 120, the press-fitting of the opening closing member 170 and the attachment of the cover member 180 are finished, the terminals 130 may be inserted into the respective terminal inserting portions 145 and the terminal holding portion 140.

As described above, in this fourth embodiment, the interior of the case CS can be waterproofed from the outside, i.e. the entrance of moisture into contact parts of the circuit board 110 and the terminals 130 can be prevented by a simple structure including the lid portion 128 for sealing the opening 121 of the main body 126 in the board housing portion 120 of the case CS and the plurality of wire-side waterproof members 150 for sealing the plurality of terminal inserting portions 145.

Further, in this embodiment, the opening 121 of the main body 126 can be sealed only by press-fitting the opening closing member 170 into the opening 121 of the main body 126. Furthermore, the cover member 180 protects the opening closing member 170 by covering the opening closing member 170, whereby a good sealed state can be held.

Since the circuit board 110 is restrained from both sides in the board inserting direction between the opening closing member 170 and the board restraining portion (front end 144a of the rear inner wall 144 in this embodiment) and held at the board holding position, vibration of the circuit board 110 toward both sides in the board inserting direction is suppressed, with the result that vibration generated at the contact parts of the contact conductors on the circuit board 110 and the board contact portions 131 of the terminals 130 is suppressed. Thus, the occurrence of troubles such as an insufficient contact state at the contact parts is suppressed. Furthermore, since the opening closing member 170 is resilient, vibration of the circuit board 110 toward the both sides in the board inserting direction is absorbed by the opening closing member 170, whereby the circuit board 110 can be stably held at the board holding position.

In this embodiment, the opening closing member 170 and the cover member 180 may be integrated. For example, the opening closing member 170 and the cover member 180 may be so bonded that the front surface of the opening closing member 170 and the inner surface of the main wall 181 of the cover member 180 are held in close contact with each other or the both members 170, 180 may be formed into a single member by insert molding.

Figure 20:
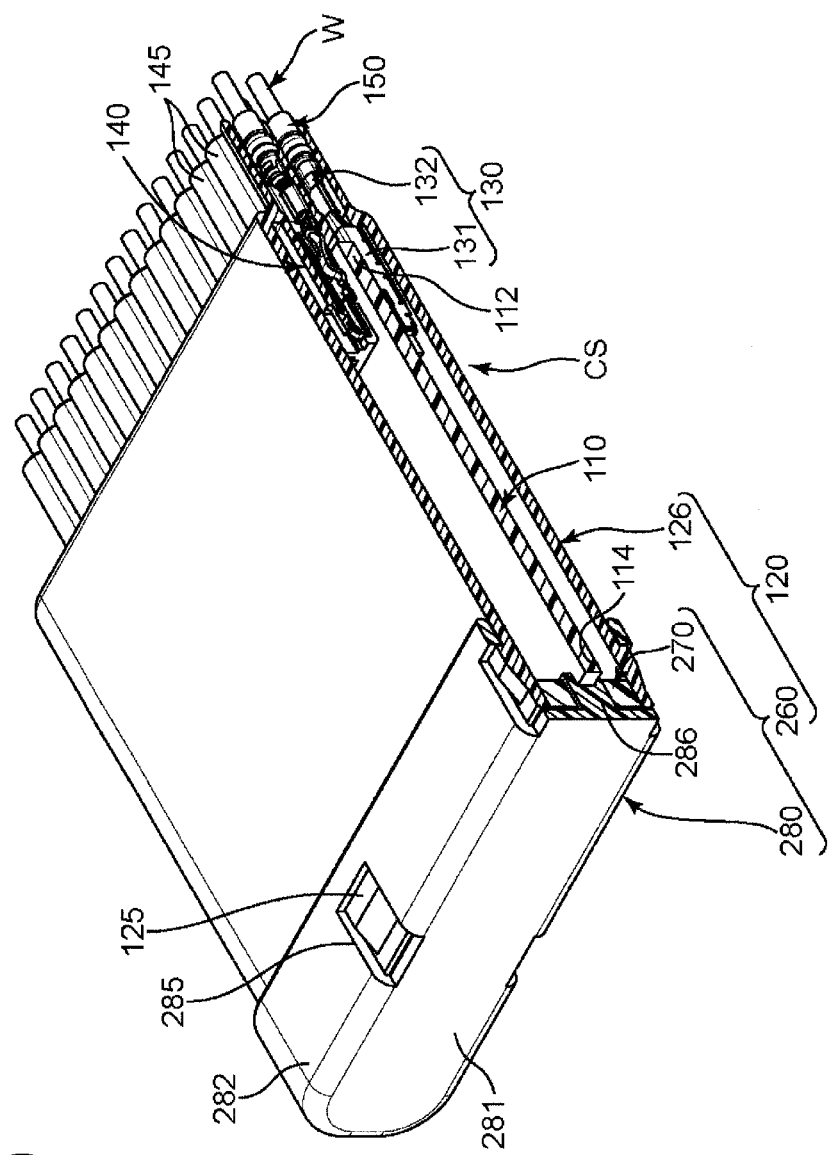
FIG. 20 is a perspective view in section showing a state where a circuit board, a case, terminals and wire-side waterproof members of an electronic circuit unit according to a fifth embodiment of the present invention are assembled.
Figure 21:
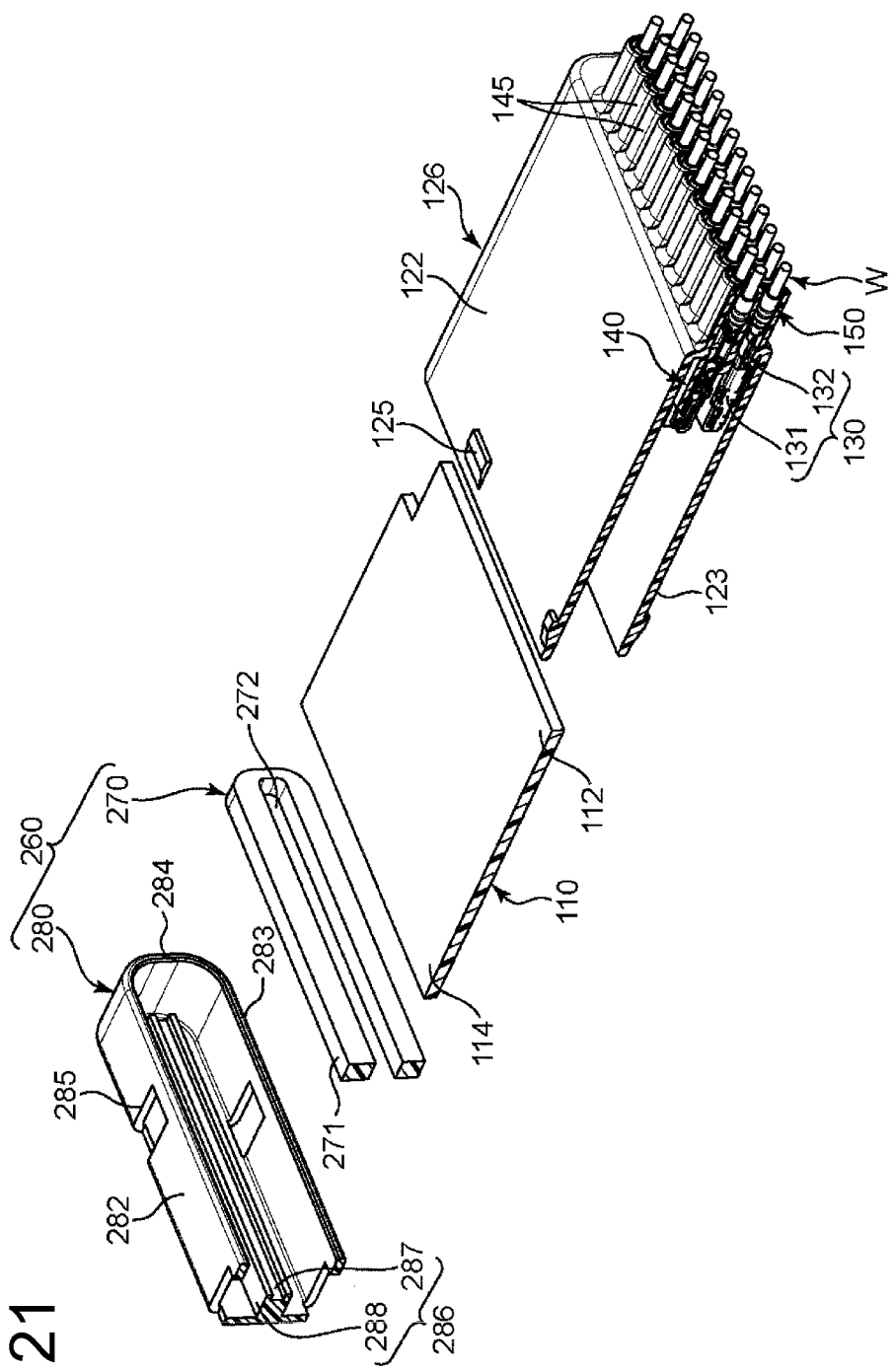
FIG. 21 is an exploded perspective view in section of the electronic circuit unit shown in FIG. 20.

Next, a fifth embodiment of the present invention is described mainly with reference to FIGS. 20 and 21. An electronic circuit unit according to this fifth embodiment differs from that according to the fourth embodiment in the structure of the lid portion constituting the case CS and other parts are the same as those of the fourth embodiment. Thus, only differences of the fifth embodiment from the fourth embodiment, i.e. the lid portion and parts relating thereto are described below. The same constituent elements as those included in the fourth embodiment, i.e. constituent elements other the lid portion are denoted by the same reference signs and not described.

The electronic circuit unit according to this fifth embodiment includes a lid portion 260 instead of the lid portion 128 according to the fourth embodiment. This lid portion 260 includes a lid main body 280 to be attached to the main body 126 of the board housing portion 120 and a lid-side waterproof member 270 to be interposed between the lid main body 280 and the main body 126 to seal the opening 121 of the main body 126 together with the lid main body 280.

The lid-side waterproof member 270 according to this embodiment is made of a resilient material such as rubber and includes a through hole 272 long in a width direction of the circuit board 110 in a substantially central part thereof. More specifically, the lid-side waterproof member 270 includes the through hole 272 long in a direction perpendicular to the board inserting direction and the plate thickness direction of the circuit board 110, i.e. the width direction of the circuit board 110. This lid-side waterproof member 270 has an outer peripheral surface 271 which can be held in close contact with the inner peripheral surface of the main body 126 defining the opening 121 over the entire circumference while the lid-side waterproof member 270 is resiliently deformed, and seals the interior of the case CS by this close contact.

The lid main body 280 is made of an insulating material such as plastic and includes a main wall 281 for closing the opening 121 of the main body 126 of the case CS and a peripheral wall integrally connected to the main wall 281 and configured to cover a peripheral edge part of the opening 121 of the main body 126 from an outer side, and this peripheral wall includes a ceiling plate portion 282 and a bottom plate portion 283 for respectively covering the ceiling wall 122 and the bottom wall 123 of the main body 126 and side plate portions 284 for covering the respective side walls 124 of the main body 126. Each of the ceiling plate portion 282 and the bottom plate portion 283 includes locked portions 285, which are respectively engaged with the locking portions 125 of the board housing portion 120 to hold a state where the lid main body 280 is attached to the main body 126.

This lid main body 280 further includes a board receiving portion 286. This board receiving portion 286 projects in the board inserting direction from a substantially central part of the main wall 281 and is inserted into the through hole 272 of the lid-side waterproof member 270. In other words, the lid-side waterproof member 270 is shaped to surround the board receiving portion 286. The board receiving portion 286 sandwiches the circuit board 110 from both sides in the board inserting direction between the front end 144a of the rear inner wall 144, which is the board restraining portion, and the board receiving portion 286. The board receiving portion 286 is shaped to be long in the width direction of the circuit board 110 and includes an end receiving portion 287 for receiving the edge part 114 of the circuit board 110 in a state where the circuit board 110 is not in contact with the lid-side waterproof member 270. Specifically, the end receiving portion 287 is shaped to sandwich the edge part 114 from both sides in the plate thickness direction and come into contact with the end surface of the edge part 114.

The lid main body 280 has an outer peripheral surface 288 to be held in close contact with an inner peripheral surface defining the through hole 272 in the lid-side waterproof member 270. This board receiving portion 286 may not necessarily project further inwardly into the case CS than the lid-side waterproof member 270 and may be entirely located in the through hole 272.

Next, an assembling procedure of this electronic circuit unit is described. Note that the insertion of the terminals 130 into the terminal inserting portions 145 and the terminal holding portion 140 and that of the circuit board 110 into the board housing portion 120 are not described since being the same as the processes 1) and 2) in the description of the assembling procedure of the electronic circuit unit according to the fourth embodiment.

3) Attachment of the Lid-Side Waterproof Member 270 to the Lid Main Body 280

The lid-side waterproof member 270 is attached to the lid main body 270. Specifically, the board receiving portion 286 is so press-fitted into the through hole 272 that the outer peripheral surface 288 of the board receiving portion 286 comes into close contact with the inner peripheral surface defining the through hole 272 in the lid-side waterproof member 270. In this state, an end part of the board receiving portion 286 projects into the case from the through hole 272 of the lid-side waterproof member 270.

4) Press-Fitting of the Lid-Side Waterproof Member 270 and Attachment of the Lid Main Body 280

The lid-side waterproof member 270 is so press-fitted into the main body 126 that the inner peripheral surface defining the opening 121 of the main body 126 and the outer peripheral surface 271 of the lid-side waterproof member 270 are held in close contact. Simultaneously with this, the lid main body 280 is attached to the main body 126. In this way, the interior of the case CS is sealed. During this attachment, the inner surface of the main wall 281 of the lid main body 280 comes into contact with or comes very close to the end surface of the main body 126 on the side where the opening 121 is provided, the locked portions 285 of the lid main body 280 are engaged with the locking portions 125 of the main body 126, and the end receiving portion 287 receives the edge part 114 of the circuit board 110 while the board receiving portion 286 is at least partly located in the through hole 272. As a result, the circuit board 110 is fixed at the board holding position. Specifically, the circuit board 110 is sandwiched between the board receiving portion 286 and the front end 144a of the rear inner wall 144 of the terminal holding portion 140 in the board inserting direction, with the result that the circuit board 110 is fixed at the board holding position. Thus, the contact of the respective conductors for connection of the circuit board 110 at the board holding position and the resilient contact pieces 136 of the respective terminals 130 held in the terminal holding portion 140 is guaranteed.

Further, in the above assembling procedure, the lid-side waterproof member 270 and the lid main body 280 may be simultaneously attached to the main body 126 in a state where the lid-side waterproof member 270 is attached to the lid main body 280 in advance, i.e. the board receiving portion 286 is so press-fitted into the through hole 272 that the outer peripheral surface 288 of the board receiving portion 286 comes into close contact with the inner peripheral surface defining the through hole 272 in the lid-side waterproof member 270.

As described above, the circuit board 110 according to this fifth embodiment is held at the board holding position by being sandwiched between the board receiving portion 286 and the board restraining portion (rear inner wall 144 in this embodiment) from both sides in the board inserting direction in a state not in contact with the lid-side waterproof member 270. Thus, vibration or the like of the circuit board 110 is unlikely to be transmitted to the lid-side waterproof member 270 and it is suppressed that this vibration adversely affects sealing between the lid-side waterproof member 270 and the main body 126.

The lid-side waterproof member 270 and the lid main body 280 may be integrated. For example, the two may be bonded to each other or formed into a single member by insert molding. Conversely, if the front side of the lid-side waterproof member 270 and the inner surface of the main wall 281 of the lid main body 280 are in close contact with each other, the inner peripheral surface defining the through hole 272 of the lid-side waterproof member 270 and the outer peripheral surface 288 of the board receiving portion 286 need not necessarily be in close contact with each other.

In the fifth embodiment, a material, which is fluid, but has a high viscosity, such as grease or thermosetting resin or the like can be used for the lid-side waterproof member 270 interposed between the lid main body 280 and the main body 126 of the board housing portion 120. Specifically, a part of a portion made of the material having a high viscosity, thermosetting resin or the like may form a sealing portion by providing the portion made of the material having a high viscosity, thermosetting resin or the like on either one or both of a part of the inner surface of the main wall 281 of the lid main body 280 surrounding the outer peripheral surface 288 of the board receiving portion 286 and the entire outer peripheral surface of a part defining the opening 121 of the main body 126 and, then, attaching the lid main body 280 to the main body 126. In this case, preferably, the board receiving portion 286 is shaped to form a tiny clearance between the inner peripheral surface defining the opening 121 of the main body 126 and the board receiving portion 286 and this clearance is sealed by the portion made of the material having a high viscosity, thermosetting resin or the like.

This point also holds true for the wire-side waterproof member. Although the wire-side waterproof member 150 is made of the resiliently deformable material such as rubber in the fourth and fifth embodiments, the wire-side waterproof member according to the present invention can be made of a material, which is fluid, but has a high viscosity, such as grease or thermosetting resin or the like. Specifically, the clearance can be sealed by filling a portion made of a material having a high viscosity such as grease, thermosetting resin or the like into a clearance between the outer peripheral surface of the wire W and the inner peripheral surface of the terminal inserting portion 145.

Further, in the fourth and fifth embodiments, the wire-side waterproof member 150 may be mounted into the terminal inserting portion 145 with a sealing member interposed between the outer peripheral surfaces of the first and second waterproof portions 153, 154 and the inner peripheral surface of the terminal inserting portion 145. Similarly, the opening closing member 170 according to the fourth embodiment or the lid-side waterproof member 270 according to the fifth embodiment may be attached to the main body 126 with a sealing member interposed between the outer peripheral surface 171, 271 thereof and the inner peripheral surface defining the opening 121 of the main body 126.

Figure 22:
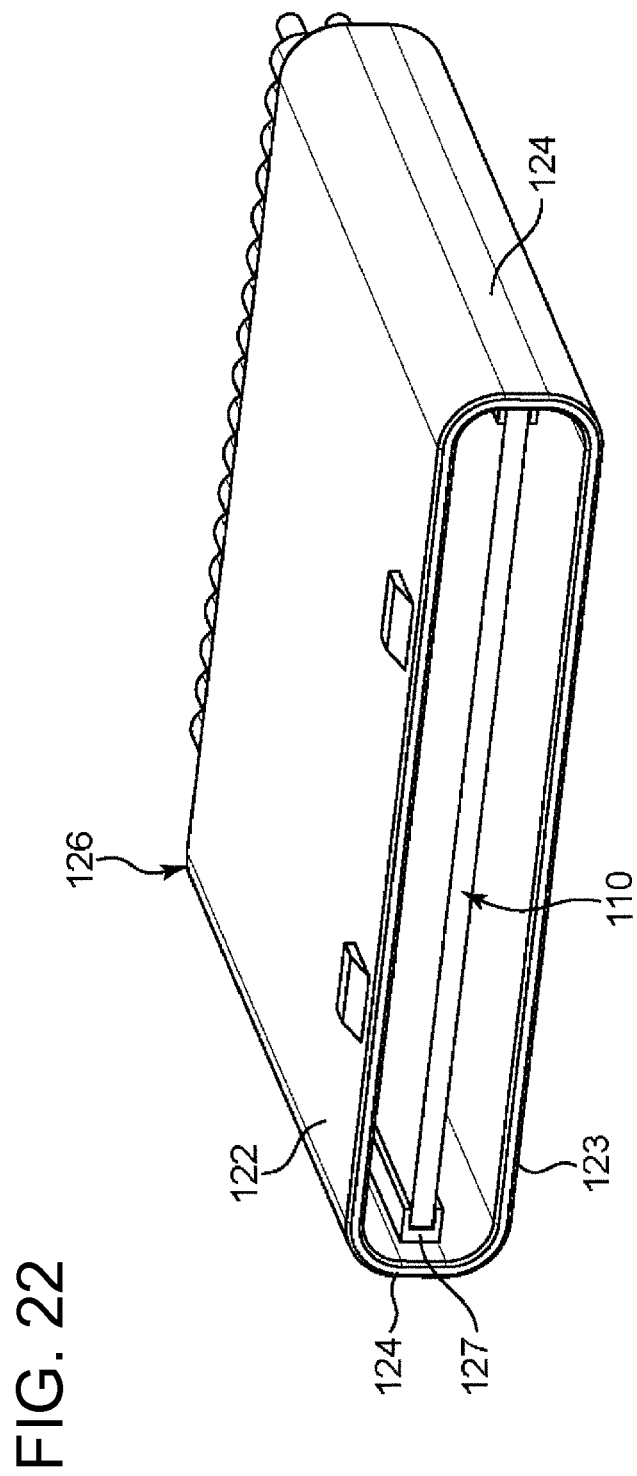
FIG. 22 is a view showing examples of the board housing portion of the case and the circuit board held therein.
Figure 23:
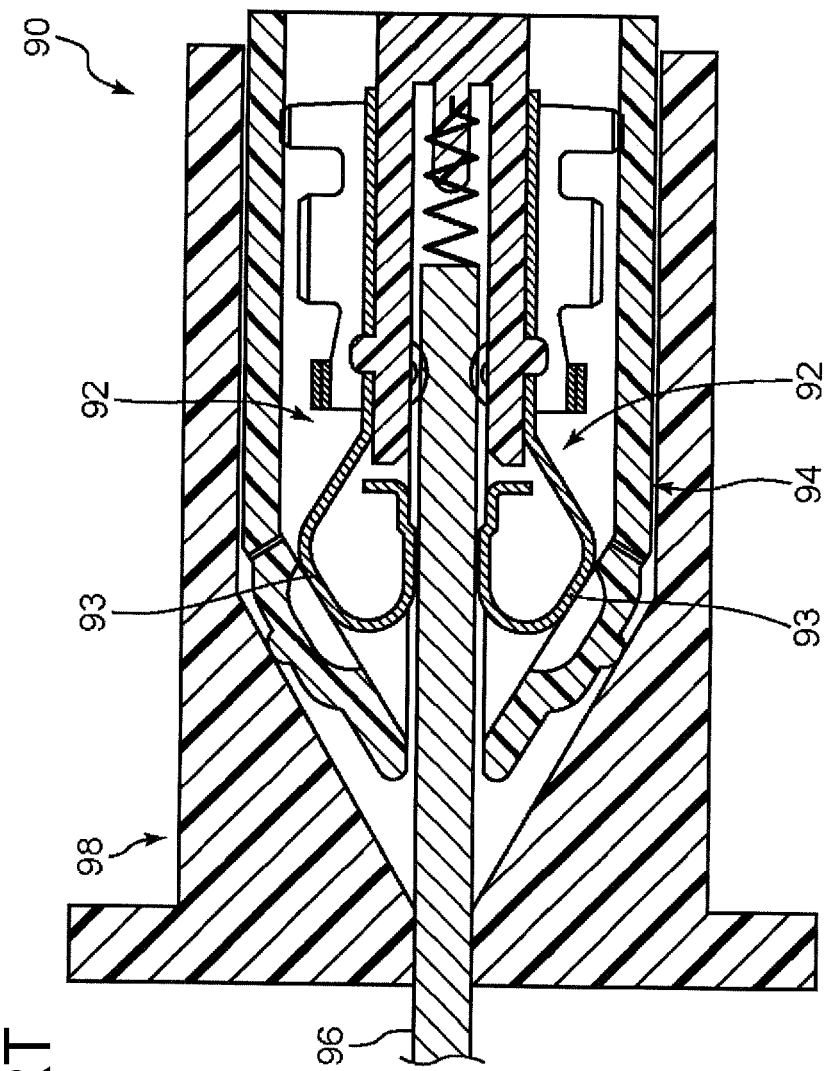
FIG. 23 is a sectional view showing an example of a conventional card edge connector.

As shown in FIG. 22, a guide rail 127 may be formed on the inner surface of each side wall 124 of the board housing portion 120 in the fourth and fifth embodiments. The guide rails 127 are shaped to sandwich the left and right edge parts of the circuit board 110 from both sides in the plate thickness direction and extend in the board inserting direction. Further, the guide rails 127 are formed at the same height as the rear inner wall 144. By forming the guide rails 127, the circuit board 110 is precisely and stably inserted in the board inserting direction while being guided by the guide rails 127. Further, since the left and right edge parts of the circuit board 110 are sandwiched from both sides in the plate thickness direction of the circuit board 110 after the insertion, the circuit board 110 is stably held.

Further, the cover member 180 of the fourth embodiment or the lid main body 280 of the fifth embodiment is attached to the main body 126 by the engagement of the locking portions 125 and the locked portions 185. However, if the cover member 180 or the lid main body 280 needs not be removably attachable to the main body 126, the cover member 180 or the lid main body 280 may include only the main wall 181, 281 and the inner surface of the main wall 181, 281 may be bonded to the end surface of the main body 126 on the side where the opening 121 is provided.

As described above, the present invention provides an electronic circuit unit which includes a circuit board, a case for housing the circuit board and a plurality of terminals for external connection and can be miniaturized and simplified in structure.

A first electronic circuit unit provided by the present invention includes a circuit board including an edge part and a plurality of conductors for connection provided on a surface thereof, a case configured to house the circuit board, and a plurality of terminals provided on ends of wires to be connected to the respective conductors for connection of the circuit board and each including a board contact portion which can come into contact with the corresponding conductor for connection. The case includes a board housing portion configured to house the circuit board while holding the circuit board at a specific board holding position and a terminal holding portion configured to hold each terminal, and the terminal holding portion includes a plurality of terminal accommodating chambers into which each terminal is insertable from the outside to the inside of the case, and a plurality of terminal locking portions configured to lock the terminal inserted into each terminal accommodating chamber at a position where the board contact portion of the terminal comes into contact with the corresponding one of the conductors for connection.

In this electronic circuit unit, it is not necessary to use both a terminal-side housing and a board-side housing as before, and the contact of the board contact portion of each terminal and the conductor for connection of the circuit board is guaranteed by a simple structure utilizing the case. Specifically, the contact of each conductor for connection of the circuit board and the board contact portion of each terminal is achieved and held by inserting the terminal into each terminal accommodating chamber in the terminal holding portion of the case and locking the terminal and holding the circuit board at the board holding position in the board housing portion of the same case. Thus, it is not necessary to include a dedicated housing for holding the terminals as before.

Preferably, the board housing portion of the case includes a main body including an opening open toward a side opposite to the terminal holding portion and shaped to allow the circuit board to be inserted in a board inserting direction perpendicular to a plate thickness direction of the circuit board and toward the terminal holding portion through the opening with the edge part in the lead and a lid portion to be removably attached to the main body to close the opening of the main body, and the main body includes side walls configured to hold the circuit board from both sides in the plate thickness direction while guiding the circuit board in the board inserting direction.

In this example, the circuit board is easily set in the board housing portion. Specifically, the lid portion may be attached to the main body to close the opening after the circuit board is inserted in the board inserting direction through the opening with the edge thereof in the lead and reaches a board restraining portion of the terminal holding portion in a state where the lid portion is removed from the opening. This causes the circuit board to be stably held at the board holding position between the lid portion and the board restraining portion.

Further, with respect to the board inserting direction, the terminal holding portion preferably includes a board restraining portion configured to hold the circuit board at the board holding position by sandwiching the circuit board between the lid portion and the board restraining portion from both sides in the board inserting direction.

Here, the conductors for connection are more preferably provided on both sides of the edge part of the circuit board. In this case, preferably, the terminal holding portion includes an intermediate wall to be interposed between a group of the terminals to be held in contact with the conductors for connection on one surface of the circuit board and a group of the terminals to be held in contact with the conductors for connection on the other surface of the circuit board, and a front end part of the intermediate wall is retracted from the board contact portion of each terminal and constitutes the board restraining portion to restrain the edge part of the circuit board interposed between the both groups of the terminals.

In this electronic circuit unit, it is preferable to prevent the circuit board from being inserted in a vertically inverted posture into the board housing portion. This prevention is achieved by a simple structure composed of, for example, a combination of an inverted insertion preventing member fixed on one surface of the circuit board in such a manner as to project from this surface and an insertion preventing portion provided in the case and configured to prevent the circuit board from being completely inserted by coming into contact with the inverted insertion preventing member only when the circuit board is inserted in the vertically inverted posture into the board housing portion.

Preferably, this electronic circuit unit further includes a wire-side waterproof member provided for each wire to seal the interior of the case, the case further includes a plurality of terminal inserting portions through which the respective terminals are insertable from the outside to the inside of the case, the terminal holding portion is shaped to be able to receive the terminals inserted through the respective terminal inserting portions, the lid portion is attached to the main body to seal the interior of the case by closing the opening of the main body, and each wire-side waterproof member seals a clearance between each of the plurality of wires and the inner peripheral surface of the corresponding terminal inserting portion to seal the interior of the case. Since the case of this electronic circuit unit includes the main body with the opening allowing the insertion of the circuit board and the terminal inserting portions allowing the insertion of the terminals, the interior of the case can be sealed by the lid portion configured to seal the opening of the main body and the wire-side waterproof members configured to seal the plurality of terminal inserting portions. This enables contact parts of the circuit board and the terminals to be waterproofed by a simple structure.

Specifically, the lid portion preferably includes a lid main body to be attached to the main body to close the opening of the main body and a lid-side waterproof member configured to seal the opening of the main body by being interposed between the lid main body and the main body. This lid-side waterproof member is unlikely to be affected from the outside of the case and can satisfactorily hold sealing property of a sealing portion thereof since being interposed between the lid main body and the main body.

More specifically, the lid-side waterproof member preferably can be press-fitted into the opening of the main body while being resiliently deformed, and has an outer peripheral surface to be held in close contact with the inner peripheral surface of the board housing portion defining the opening of the main body over the entire circumference by the press-fitting. This lid-side waterproof member can stably seal the interior of the case by the outer peripheral surface thereof being held in close contact with the inner peripheral surface when the lid-side waterproof member is press-fitted into the opening of the main body.

Preferably, to hold the circuit board, the lid main body includes a main wall shaped to cover the opening of the main body and a board receiving portion projecting into the case in the board inserting direction from the main wall and configure to receive an edge part of the circuit board opposite to the edge part where the conductors for connection are provided, the lid-side waterproof member has an outer peripheral surface to be held in close contact with an inner peripheral surface surrounding the board receiving portion and defining the opening of the main body over the entire circumference, and the terminal holding portion includes a board restraining portion configured to hold the circuit board at the board holding position by restraining the circuit board from both sides in the board inserting direction between the board receiving portion and the board restraining portion.

In this electronic circuit unit, the circuit board can be restrained in the board inserting direction and the interior of the case can be stably sealed by a simple structure. Specifically, the circuit board is restrained from both sides in the board inserting direction between the board receiving portion of the lid main body and the board restraining portion, thereby suppressing an unstable contact state of each conductor for connection and each terminal due to a displacement of the circuit board in this direction. Further, the occurrence of troubles such as the transmission of vibration or the like of the circuit board to the lid-side waterproof member to make sealing between the lid-side waterproof member and the main body insufficient is also prevented.

Further, the lid portion may include an opening closing member made of a resiliently deformable material, and the opening closing member may be press-fitted into the opening of the main body while being resiliently deformed, have an outer peripheral surface to be held in close contact with an inner peripheral surface of the main body defining the opening of the main body and seal the interior of the case by the close contact.

In this example, the opening of the main body can be sealed only by press-fitting the opening closing member into the opening of the main body.

Further, as a specific example, the lid portion further includes a cover member to be attached to the main body to cover the opening closing member.

In the example, a sealed state of the opening of the main body is easily satisfactorily held. Specifically, the cover member has only to be attached to the main body to cover the opening closing member press-fitted into the main body to seal the opening of the main body. By doing so, the opening closing member is covered by the cover member and unlikely to be affected from the outside of the case, wherefore sealing property of a sealing portion thereof can be satisfactorily held.

Further, as a specific example, the wire-side waterproof member is made of a resiliently deformable material, mounted on each of the plurality of wires and shaped to be held in close contact with the inner peripheral surface of the terminal inserting portion over the entire circumference while being resiliently deformed.

In this example, the terminal inserting portion is easily sealed. Specifically, the wire-side waterproof member has only to be mounted on each wire in advance and the terminal provided on the end of the wire has only to be inserted through the terminal inserting portion. By doing so, the terminal inserting portion can be easily sealed.

Further, as a preferable example concerning the insertion and holding of the circuit board into board housing portion, the main body of the case includes side walls configured to hold the circuit board from both sides in a direction perpendicular to the board inserting direction and the plate thickness direction of the circuit board and guide rails provided on the inner surfaces of the side walls and shaped to sandwich the circuit board from both sides in the plate thickness direction and extend in the board inserting direction.

In this example, the circuit board is precisely and stably inserted in the board inserting direction through the opening of the main body and stably held by the guide rails after the insertion.

A second electronic circuit unit provided by the present invention includes a circuit board including a first edge part and a second edge part facing opposite sides and a plurality of first conductors for connection and a plurality of second conductors for connection provided on surfaces of the respective edge parts, a case configured to house the circuit board, a plurality of first terminals provided on ends of wires to be connected to the first conductors for connection of the circuit board and each including a board contact portion which can come into contact with the corresponding first conductor for connection, and a plurality of second terminals provided on ends of wires to be connected to the second conductors for connection of the circuit board and each including a board contact portion which can come into contact with the second corresponding conductor for connection. The case is divided into a first case member and a second case member, the first case member includes a first board housing portion configured to house a part of the circuit board on the side of the first edge part while holding the part from both sides in a plate thickness direction, a first terminal holding portion configured to hold each first terminal and a first board restraining portion configured to restrain the first edge part in a board restraining direction perpendicular to the plate thickness direction of the circuit board and parallel to an axial direction of the first terminals, and the second case member includes a second board housing portion configured to house a part of the circuit board on the side of the second edge part while holding the part from both sides in the plate thickness direction, a second terminal holding portion configured to hold each second terminal and a second board restraining portion configured to restrain the second edge part in the board restraining direction. The first and second case members are shaped to restrain the circuit board between the first and second board restraining portions in a state united with each other. The first terminal holding portion includes a plurality of terminal accommodating chambers into which each first terminal is insertable from the outside to the inside of the case and a plurality of terminal locking portions configured to lock each first terminal inserted into the terminal accommodating chamber at a position where the board contact portion of the first terminal comes into contact with the corresponding one of the first conductors for connection, and the second terminal holding portion includes a plurality of terminal accommodating chambers into which each second terminal is insertable from the outside to the inside of the case and a plurality of terminal locking portions configured to lock each second terminal inserted into the terminal accommodating chamber at a position where the board contact portion of the second terminal comes into contact with the corresponding one of the second conductors for connection.

In this electronic circuit unit, the number of the wires connectable to the circuit board is increased since the first and second conductors for connection are provided on the respective first and second edge parts of the circuit board and the first and second terminals come into contact with these conductors for connection. In addition, the first terminal holding portion of the first case member and the second terminal holding portion of the second case member respectively hold the first and second terminals and the circuit board is restrained between the first and second board restraining portions by locating the circuit board in the both case members and uniting the both case members, whereby the contact of the board contact portions of the first and second terminals and the first and second conductors for connection is guaranteed.

Also in this second electronic circuit unit, it is more preferable to provide the first and second conductors for connection on both sides of the edge parts of the circuit board. In this case, preferably, the first terminal holding portion includes an intermediate wall to be interposed between a group of the first terminals to be held in contact with the first conductors for connection on one surface of the circuit board and a group of the second terminals to be held in contact with the second conductors for connection on the other surface of the circuit board, and a front end part of the intermediate wall is located at a position retracted from the board contact portion of each first terminal and constitutes the first board restraining portion to restrain the first edge part of the circuit board located between the both groups of the first terminals. The second terminal holding portion includes an intermediate wall to be interposed between a group of the second terminals to be held in contact with the second conductors for connection on one surface of the circuit board and a group of the second terminals to be held in contact with the second conductors for connection on the other surface of the circuit board, and a front end part of the intermediate wall is located at a position retracted from the board contact portion of each second terminal and constitutes the second board restraining portion to restrain the second edge part of the circuit board located between the both groups of the second terminals.

Also in this electronic circuit unit, it is preferable to prevent the circuit board from being inserted in a vertically inverted posture into the first and second board housing portions. This prevention is also achieved by a simple structure composed of, for example, a combination of an inverted insertion preventing member fixed on one surface of the circuit board in such a manner as to project from this surface and an insertion preventing portion provided in the case member accommodating the inverted insertion preventing member out of the first and second case members and configured to prevent the two case members from being united by coming into contact with the inverted insertion preventing member only when the circuit board is inserted in the vertically inverted posture into the board housing portions.

Further, it is also possible to identically shape the first and second case members, whereby the productivity of the electronic circuit unit is improved.

The invention claimed is:
1. An electronic circuit unit, comprising:
a circuit board including an edge part and a plurality of conductors for connection provided on a surface thereof;
a plurality of terminals provided on ends of wires to be connected to the respective conductors for connection of the circuit board and each including a board contact portion which comes into contact with the corresponding conductor for connections;
a case including a board housing portion configured to house the circuit board while holding the circuit board at a specific board holding position and a terminal holding portion configured to hold each terminal;

the board housing portion has a housing main body with side walls configured to hold the circuit board from both sides in a plate thickness direction of the circuit board while guiding the circuit board in a board inserting direction and an opening open toward a side opposite to the terminal holding portion and shaped to allow the circuit board to be inserted in the board inserting direction perpendicular to the plate thickness direction and toward the terminal holding portion through the opening with the edge part in the lead;

the terminal holding portion includes a plurality of terminal insertion portions through which the respective terminals are insertable from the outside to the inside of the case, a plurality of terminal accommodating chambers into which each terminal is inserted, and a plurality of terminal locking portions configured to lock the terminal inserted into each terminal accommodating chamber at a position where the board contact portion of the terminal comes into contact with the corresponding one of the conductors for connection;

a lid removably attached to the housing main body, the lid including a lid main body to be attached to the housing main body to close the opening, and a lid-side waterproof member configured to seal the opening of the housing main body being interposed between the lid main body and the main body; and a plurality of wire-side waterproof members provided to seal a clearance between each of the plurality of wires and inner peripheral surfaces of the corresponding terminal inserting portion.

2. The electronic circuit unit of claim 1, wherein the terminal holding portion of the case includes a board restraining portion configured to hold the circuit board at the board holding position by sandwiching the circuit board between the lid and the board restraining portion from both sides in the board inserting direction.

3. The electronic circuit unit of claim 2, wherein:
the conductors for connection are provided on both sides of the edge part of the circuit board;
the terminal holding portion includes an intermediate wall to be interposed between a group of the terminals to be held in contact with the conductors for connection on one surface of the circuit board and a group of the terminals to be held in contact with the conductors for connection on the other surface of the circuit board; and
a front end part of the intermediate wall is retracted from the board contact portion of each terminal and constitutes the board restraining portion to restrain the edge part of the circuit board interposed between the both groups of the terminals.

4. The electronic circuit unit of claim 1, further comprising:
an inverted insertion preventing member fixed on one surface of the circuit board in such a manner as to project from the one surface; and
an insertion preventing portion provided in the case and configured to prevent the circuit board from being completely inserted by coming into contact with the inverted insertion preventing member only when the circuit board is inserted in a vertically inverted posture into the board housing portion.

5. The electronic circuit unit of claim 1, wherein the lid-side waterproof member is press-fitted into the opening of the main body while being resiliently deformed, and has an outer peripheral surface to be held in close contact with the inner peripheral surface of the board housing portion defining the opening of the main body over the entire circumference by the press-fitting.

6. The electronic circuit unit of claim 5, wherein:
the lid main body includes a main wall shaped to cover the opening of the main body and a board receiving portion projecting into the case in the board inserting direction from the main wall and configure to receive an edge part of the circuit board opposite to the edge part where the conductors for connection are provided;
the lid-side waterproof member has an outer peripheral surface to be held in close contact with an inner peripheral surface surrounding the board receiving portion and defining the opening of the main body over the entire circumference: and
the terminal holding portion includes a board restraining portion configured to hold the circuit board at the board holding position by restraining the circuit board from both sides in the board inserting direction between the board receiving portion and the board restraining portion.

7. The electronic circuit unit of claim 1, wherein:
the lid includes an opening closing member made of a resiliently deformable material; and
the opening closing member is press-fitted into the opening of the main body while being resiliently deformed, has an outer peripheral surface to be held in close contact with an inner peripheral surface of the main body defining the opening of the main body and seals the interior of the case by the close contact.

8. The electronic circuit unit of claim 7, further comprising a cover member to be attached to the main body to cover the opening closing member.

9. The electronic circuit unit of claim 1, wherein each wire-side waterproof member is made of a resiliently deformable material, mounted on each of the plurality of wires and shaped to be held in close contact with the inner peripheral surface of the terminal inserting portion over the entire circumference while being resiliently deformed.

10. The electronic circuit unit of claim 1, wherein the main body of the case includes side walls configured to hold the circuit board from both sides in a direction perpendicular to the board inserting direction and the plate thickness direction of the circuit board and guide rails provided on the inner surfaces of the side walls and shaped to sandwich the circuit board from both sides in the plate thickness direction and extend in the board inserting direction.

11. An electronic circuit unit, comprising:
a circuit board including a first edge part and a second edge part facing opposite sides and a plurality of first conductors for connection and a plurality of second conductors for connection provided on opposed first and second surfaces of the respective edge parts;
a plurality of first terminals provided on ends of wires to be connected to the first conductors for connection of the circuit board and each including a board contact portion which comes into contact with the corresponding first conductor for connection; and
a plurality of second terminals provided on ends of wires to be connected to the second conductors for connection of the circuit board and each including a board contact portion which comes into contact with the corresponding second conductor for connection; and
a case configured to house the circuit board;
wherein:
the case is divided into a first case member and a second case member;

the first case member includes a first board housing portion configured to house a part of the circuit board on the side of the first edge part while holding the part from both sides in a plate thickness direction, a first terminal holding portion configured to hold each first terminal, the first terminal holding portion including an intermediate wall interposed between a group of the first terminals to be held in contact with the first conductors for connection on the first surface of the circuit board and a group of the second terminals to be held in contact with the second conductors for connection on the second surface of the circuit board, and a front end part of the intermediate wall located at a position retracted from the board contact portion of each first terminal and constituting a first board restraining portion configured to restrain the first edge part in a board restraining direction perpendicular to the plate thickness direction of the circuit board and parallel to an axial direction of the first terminals;

the second case member includes a second board housing portion configured to house a part of the circuit board on the side of the second edge part while holding the part from both sides in the plate thickness direction, a second terminal holding portion configured to hold each second terminal, the second terminal holding portion including an intermediate wall interposed between a group of the second terminals to be held in contact with the second conductors for connection on the first surface of the circuit board and a group of the second terminals to be held in contact with the second conductors for connection on the second surface of the circuit board, and a front end part of the intermediate wall is located at a position retracted from the board contact portion of each second terminal and constituting a second board restraining portion configured to restrain the second edge part in the board restraining direction;

the first and second case members are shaped to restrain the circuit board between the first and second board restraining portions in a state united with each other;

the first terminal holding portion includes a plurality of terminal accommodating chambers into which each first terminal is insertable from the outside to the inside of the case and a plurality of terminal locking portions configured to lock each first terminal inserted into the terminal accommodating chamber at a position where the board contact portion of the first terminal comes into contact with the corresponding one of the first conductors for connection; and the second terminal holding portion includes a plurality of terminal accommodating chambers into which each second terminal is insertable from the outside to the inside of the case and a plurality of terminal locking portions configured to lock each second terminal inserted into the terminal accommodating chamber at a position where the board contact portion of the second terminal comes into contact with the corresponding one of the second conductors for connection.

12. The electronic circuit unit of claim 11, further comprising:

an inverted insertion preventing member fixed on one surface of the circuit board in such a manner as to project from this surface; and an insertion preventing portion provided in the case member accommodating the inverted insertion preventing member out of the first and second case members and configured to prevent the two case members from being united by coming into contact with the inverted insertion preventing member only when the circuit board is inserted in a vertically inverted posture into the board housing portion.

13. The electronic circuit unit of claim 11, wherein the first and second case members are identically shaped.

14. An electronic circuit unit, comprising:

a circuit board including an edge part and a plurality of conductors for connection provided on a surface thereof;

a plurality of terminals provided on ends of wires to be connected to the respective conductors for connection of the circuit board and each including a board contact portion which comes into contact with the corresponding conductor for connection;

a case including a board housing portion configured to house the circuit board while holding the circuit board at a specific board holding position and a terminal holding portion configured to hold each terminal;

the board housing portion has a main body with side walls configured to hold the circuit board from both sides in a plate thickness direction of the circuit board while guiding the circuit board in the board inserting direction and an opening open toward a side opposite to the terminal holding portion and shaped to allow the circuit board to be inserted in a board inserting direction perpendicular to the plate thickness direction and toward the terminal holding portion through the opening with the edge part in the lead;

the terminal holding portion includes a plurality of terminal insertion portions through which the respective terminals are insertable from the outside to the inside of the case, a plurality of terminal accommodating chambers into which each terminal is inserted, and a plurality of terminal locking portions configured to lock the terminal inserted into each terminal accommodating chamber at a position where the board contact portion of the terminal comes into contact with the corresponding one of the conductors for connection;

a lid portion removably attached to the main body to close the opening, the lid portion including an opening closing member made of a resiliently deformable material press-fitted into the opening of the main body while being resiliently deformed and an outer peripheral surface held in close contact with an inner peripheral surface of the opening of the main body to seal the interior; and a plurality of wire-side waterproof members provided to seal a clearance between each of the plurality of wires and inner peripheral surfaces of the corresponding terminal inserting portion.

15. The electronic circuit unit of claim 14, wherein the terminal holding portion of the case includes a board restraining portion configured to hold the circuit board at the board holding position by sandwiching the circuit board between the lid portion and the board restraining portion from both sides in the board inserting direction.

16. The electronic circuit unit of claim 15, wherein:

the conductors for connection are provided on both sides of the edge part of the circuit board;

the terminal holding portion includes an intermediate wall to be interposed between a group of the terminals to be held in contact with the conductors for connection on one surface of the circuit board and a group of the terminals to be held in contact with the conductors for connection on the other surface of the circuit board; and a front end part of the intermediate wall is retracted from the board contact portion of each terminal and constitutes the board restraining portion to restrain the edge part of the circuit board interposed between the both groups of the terminals.

17. The electronic circuit unit of claim 14, further comprising:
   an inverted insertion preventing member fixed on one surface of the circuit board in such a manner as to project from the one surface; and
   an insertion preventing portion provided in the case and configured to prevent the circuit board from being completely inserted by coming into contact with the inverted insertion preventing member only when the circuit board is inserted in a vertically inverted posture into the board housing portion.

18. The electronic circuit unit of claim 14, further comprising a cover member to be attached to the main body to cover the opening closing member.

19. The electronic circuit unit of claim 14, wherein each wire-side waterproof member is made of a resiliently deformable material, mounted on each of the plurality of wires and shaped to be held in close contact with the inner peripheral surface of the terminal inserting portion over the entire circumference while being resiliently deformed.

20. The electronic circuit unit of claim 14, wherein the main body of the case includes side walls configured to hold the circuit board from both sides in a direction perpendicular to the board inserting direction and the plate thickness direction of the circuit board and guide rails provided on the inner surfaces of the side walls and shaped to sandwich the circuit board from both sides in the plate thickness direction and extend in the board inserting direction.

* * * * *